US011346768B1

(12) United States Patent
James et al.

(10) Patent No.: US 11,346,768 B1
(45) Date of Patent: May 31, 2022

(54) VORTEX POLARIMETER

(71) Applicant: Onto Innovation Inc., Wilmington, MA (US)

(72) Inventors: Kenneth E. James, Morgan Hill, CA (US); John F. Lesoine, San Jose, CA (US); Pedro Vagos, Chennevieres (FR)

(73) Assignee: Onto Innovation Inc., Wilmington, MA (US)

( * ) Notice: Subject to any disclaimer, the term of this patent is extended or adjusted under 35 U.S.C. 154(b) by 0 days.

(21) Appl. No.: 17/110,214

(22) Filed: Dec. 2, 2020

(51) Int. Cl.
G01N 21/21 (2006.01)
G01J 4/04 (2006.01)
(Continued)

(52) U.S. Cl.
CPC ............ G01N 21/21 (2013.01); G01B 11/02 (2013.01); G01J 4/04 (2013.01); G03F 7/70625 (2013.01); *G01N 2201/0633* (2013.01)

(58) Field of Classification Search
CPC ...... G01N 21/21; G01N 21/211; G01N 21/23; G01N 21/88; G01N 21/8803; G01N 21/8806; G01N 21/9501; G01N 2021/212; G01N 2021/213; G01N 2021/214; G01N 2021/215; G01N 2021/216; G01N 2021/217; G01N 2021/218;
(Continued)

(56) References Cited

U.S. PATENT DOCUMENTS 3,874,797 A  4/1975 Kasai
4,306,809 A  12/1981 Azzam
(Continued)

FOREIGN PATENT DOCUMENTS

EP  2650661 A1 * 10/2013 ............ G01N 21/21
KR  10-2009-0051031  5/2009
(Continued)

OTHER PUBLICATIONS

Radwell, N., "Achromatic vector vortex beams from a glass cone," Nature Communications, www.nature.com/naturecommunications, Feb. 10, 2016.
(Continued)

Primary Examiner — Gordon J Stock, Jr.
(74) Attorney, Agent, or Firm — Paradice and Li LLP

(57) ABSTRACT

An optical metrology device uses a multi-wavelength beam of light that has azimuthally varying polarization states and/or phase states, referred to as a vortex beam. The metrology device focuses the vortex beam on a sample under test over a large range of angles of incidence. The metrology device may detect an image of the vortex beam reflected from the sample and measure the polarization state of the return light as function of the angle of incidence and the azimuth angle, which may be further measured at a plurality of different wavelengths. The vortex beam includes azimuthally varying polarization states, thereby enabling measurement of all desired polarization states without requiring the use of moving optical components. The polarization state information detected over multiple angles of incidence and wavelengths provides data with which an accurate determination of one or more characteristics of a sample may be determined.

20 Claims, 17 Drawing Sheets

(51) Int. Cl.
*G01B 11/02* (2006.01)
*G03F 7/20* (2006.01)

(58) Field of Classification Search
CPC ............ G01N 2021/8848; G01B 11/06; G01B
11/0616; G01B 11/0641; G01B 11/065;
G01J 4/00; G01J 4/02; G01J 4/04; G03F
7/70483; G03F 7/70608; G03F 7/70616;
G03F 7/70625; G03F 7/70633; G03F
7/70651; G03F 7/7065
See application file for complete search history.

(56) References Cited

U.S. PATENT DOCUMENTS

| | | | |
|---|---|---|---|
| 6,693,711 B1 | 2/2004 | Leger et al. | |
| 6,927,888 B2 | 8/2005 | Garcia | |
| 7,064,828 B1 | 6/2006 | Rovira | |
| 7,812,963 B2 | 10/2010 | De Groot | |
| 7,978,408 B2 | 7/2011 | Sawabe | |
| 8,427,645 B2 * | 4/2013 | Vagos | G01N 21/23 356/369 |
| 8,456,632 B2 * | 6/2013 | Dainty | G01J 4/04 356/364 |
| 8,908,180 B2 * | 12/2014 | Acher | G02B 21/0092 356/369 |
| 9,389,349 B2 * | 7/2016 | Kolchin | G02B 5/3083 |
| 9,793,178 B2 * | 10/2017 | Alonso | G01N 21/21 |
| 10,921,255 B2 * | 2/2021 | Sirat | G02B 21/0072 |
| 10,955,331 B2 * | 3/2021 | Piestun | G01N 15/1429 |
| 11,067,450 B2 * | 7/2021 | Shi | G01J 11/00 |
| 2004/0012853 A1 | 1/2004 | Garcia | |
| 2006/0023987 A1 | 2/2006 | Rovira | |
| 2006/0164626 A1 | 7/2006 | Meeks et al. | |
| 2009/0040610 A1 | 2/2009 | Stallinga et al. | |
| 2011/0102793 A1 | 5/2011 | Straaijer | |
| 2011/0292402 A1 | 12/2011 | Awatsuji | |
| 2012/0069320 A1 | 3/2012 | Simonov et al. | |
| 2012/0140235 A1 | 6/2012 | Lee et al. | |
| 2012/0268812 A1 | 10/2012 | Anhut | |
| 2015/0219497 A1 | 8/2015 | Johs | |
| 2016/0313185 A1 | 10/2016 | Ma et al. | |
| 2018/0073862 A1 | 3/2018 | Sirat | |
| 2020/0025678 A1 | 1/2020 | Rapaport | |
| 2021/0349324 A1 * | 11/2021 | Vuong | G02B 27/0905 |

FOREIGN PATENT DOCUMENTS

| | | |
|---|---|---|
| WO | WO2009118148 | 10/2009 |
| WO | WO 2019/147828 A1 | 8/2019 |
| WO | WO 2020/120942 | 6/2020 |

OTHER PUBLICATIONS

Peinado, A., "Conical refraction as a tool for polarization metrology," Optics Letters, vol. 38, No. 20, Oct. 15, 2013.
Azzam, R., "Instrument matrix of the four-detector photopolarimeter: physical meaning of its rows and columns and constraints on its elements," University of New Orleans, ScholarWorks@UNO, Jan. 1, 1990.
Hawley, R., "Passive broadband full Stokes polarimeter using a Fresnel cone," https://www.researchgate.net/publication/ 327134557, Aug. 16, 2018.
Hawley, R., "Passive broadband full Stokes polarimeter using a Fresnel cone," Scientific Reports, www.nature.com/scientificreports, Feb. 25, 2019.
Rubin, N., "Polarization state generation and measurement with a single metasurface," Optics Express 21455, vol. 26, No. 17, Aug. 20, 2018.
Sparks, W., "Classical polarimetry with a twist: a compact, geometric approach," SETI Institute.
Dyankov, G., "Vortex polarimetry," In Proceedings of SPIE—The International Society for Optical Engineering, Sep. 2008.
Morales, G., "Spatially resolved polarimetry using conventional and unconventional polarization states," Centro de Investigaciones en Optica, A.C., Feb. 23, 2017.
Chang, J., "Single-shot spatially modulated Stokes polarimeter based on a GRIN lens," Optics Letters, vol. 39, No. 9, May 1, 2014.
Wang, X., "Full vector measurements of converging terahertz beams with linear, circular, and cylindrical vortex polarization," Optics Express, vol. 22, No. 20, Oct. 6, 2014.
U.S. Appl. No. 16/264,710, filed Feb. 1, 2019.
Non-Final Office Action dated Jun. 22, 2020, in U.S. Appl. No. 16/264,710, filed Feb. 1, 2019.
Final Office Action dated Nov. 4, 2020, in U.S. Appl. No. 16/264,710, filed Feb. 1, 2019.
Restriction dated Mar. 23, 2021, in U.S. Appl. No. 16/264,710, filed Feb. 1, 2019.
Revised Restriction dated May 17, 2021, in U.S. Appl. No. 16/264,710, filed Feb. 1, 2019.
Non-Final Office Action dated Aug. 24, 2021, in U.S. Appl. No. 16/264,710, filed Feb. 1, 2019.
Notice of Allowance dated Jan. 1, 2021, in U.S. Appl. No. 16/796,648, filed Feb. 20, 2020.
Non-Final Office Action dated Feb. 1, 2021, in U.S. Appl. No. 16/796,648, filed Feb. 20, 2020.
Final Office Action dated Jul. 28, 2021, in U.S. Appl. No. 16/796,648, filed Feb. 20, 2020.
Notice of Allowance dated Nov. 16, 2021, in U.S. Appl. No. 16/796,648, filed Feb. 20, 2020.
International Search Report and Written Opinion dated May 13, 2021, in PCT Application No. PCT/US2021/014431, filed Jan. 21, 2021.
International Search Report and Written Opinion dated Feb. 8, 2022, in PCT Application No. PCT/US2021/055961, filed Oct. 21, 2021.

* cited by examiner

| 350 | 353 | 356 | 358 | 360 | 362 | 364 | 366 | 368 | 370 |
|---|---|---|---|---|---|---|---|---|---|
| 372 | | | | | | | | | 390 |
| 392 | | | | | | | | | 418 |
| 421 | | | | | | | | | 449 |
| 452 | | | | | | | | | 483 |
| 487 | | | | | | | | | 524 |
| 528 | | | | | | | | | 573 |
| 578 | | | | | | | | | 629 |
| 635 | | | | | | | | 688 | Full |

| Vortex PSG states | PSA: rotating retarder* + Polarizers Signals | (*) Rotating retarder : d=45 deg Measurable MM elements with 1 PSG state | Measurable MM elements with 2 PSG states |
|---|---|---|---|
| azimuthal pol. | Idc = {M11 + a.M21 - M12 - a.M22}.Io<br>Ic2 = 0<br>Is2 = {M41 - M42}.Io<br>Ic4 = {M21 - M22}.Io<br>Is4 = {M31 - M32}.Io | M11 + a.M21 - M12 - a.M22<br>0<br>M41 - M42<br>M21 - M22<br>M31 - M32 | ●●●●<br>●●●●<br>○○○○<br>●●●● |
| radial pol. | Idc = {M11 + a.M21 + M12 + a.M22}.Io<br>Ic2 = 0<br>Is2 = {M41 + M42}.Io<br>Ic4 = {M21 + M22}.Io<br>Is4 = {M31 + M32}.Io | M11 + a.M21 + M12 + a.M22<br>0<br>M41 + M42<br>M21 + M22<br>M31 + M32 | |
| p=s +45deg | Idc = {M11 + a.M21 + M13 - a.M23}.Io<br>Ic2 = 0<br>Is2 = {M41 + M43}.Io<br>Ic4 = {M21 - M23}.Io<br>Is4 = {M31 - M33}.Io | M11 + a.M21 - M13 - a.M23<br>0<br>M41 - M43<br>M21 - M23<br>M31 - M33 | ●●●●<br>○○○○<br>●●●●<br>●●●● |
| p=s -45deg | Idc = {M11 + a.M21 + M13 + a.M23}.Io<br>Ic2 = 0<br>Is2 = {M41 + M43}.Io<br>Ic4 = {M21 + M23}.Io<br>Is4 = {M31 + M33}.Io | M11 + a.M21 + M13 + a.M23<br>0<br>M41 + M43<br>M21 + M23<br>M31 + M33 | |
| Right Circular Polar. | Idc = {M11 + a.M21 - M14 - a.M24}.Io<br>Ic2 = 0<br>Is2 = {M41 - M44}.Io<br>Ic4 = {M21 - M24}.Io<br>Is4 = {M31 - M34}.Io | M11 + a.M21 - M14 - a.M24<br>0<br>M41 - M44<br>M21 - M24<br>M31 - M34 | ●●●●<br>○○○○<br>○○○○<br>●●●● |
| Left Circular Polar. | Idc = {M11 + a.M21 + M14 + a.M24}.Io<br>Ic2 = 0<br>Is2 = {M41 + M44}.Io<br>Ic4 = {M21 + M24}.Io<br>Is4 = {M31 + M34}.Io | M11 + a.M21 + M14 + a.M24<br>0<br>M41 + M44<br>M21 + M24<br>M31 + M34 | | a = (1+1/sqrt(2)).1/2

Fig. 12E $$\begin{bmatrix} M_{00} & M_{01} & M_{02} & M_{03} \\ M_{10} & M_{11} & M_{12} & M_{13} \\ M_{20} & M_{21} & M_{22} & M_{23} \\ M_{30} & M_{31} & M_{32} & M_{33} \end{bmatrix}$$

Fig. 12F

VORTEX POLARIMETER

FIELD OF THE DISCLOSURE

Embodiments of the subject matter described herein are related generally to optical metrology, and more particularly to optical metrology using an optical vortex beam.

BACKGROUND

Semiconductor and other similar industries often use optical metrology equipment to provide non-contact evaluation of substrates during processing. With optical metrology, a sample under test is illuminated with light, e.g., at a single wavelength or multiple wavelengths. After interacting with the sample, the resulting light is detected and analyzed to determine a desired characteristic of the sample.

One type of metrology device is an ellipsometer, which detects changes in the polarization state of light reflected from a surface of a sample in order to measure characteristics of the sample. A conventional spectroscopic ellipsometer includes a broad band light source, a polarization state generator, a polarization state analyzer and a detector and uses an oblique angle of incidence, e.g., 65°. A spectroscopic ellipsometer may be used to produce ellipsometry measurement over multiple wavelengths. Typically, however, rotating optics such as one or more rotating polarizer or compensator, are used in generate the ellipsometric measurements. Generating measurements using rotating optics, however, is relatively slow. Moreover, ellipsometers are limited to a fixed angle of incidence, and provide no information with respect to other angles of incidence.

Another type of metrology device is a spectroscopic reflectometer, which measures the reflectance of a sample, typically at normal incidence. A spectroscopic reflectometer may provide limited polarization information, e.g., using a rotating polarizer and measuring reflectance at each desired polarization state. As with ellipsometers, using rotating polarizers to generate polarization information is relatively slow as it requires separate detection events for each desired polarization. Additionally, the spectroscopic reflectometer generated normally incident light and is thus limited the fixed angle of incidence, i.e., 0° and provides no information with respect to other angles of incidence.

An improved metrology device is desirable that decreases the time required to complete multiple polarization measurements at multiple angles of incidence and wavelengths.

SUMMARY

An optical metrology device uses a beam of light that includes azimuthally varying phase and/or polarization states, referred to as a vortex beam, which enables the simultaneous measurement of all desired polarization information. Accordingly, the optical metrology device does not require the use of moving optical components, such as rotating polarizers, to obtain measurement parameters, as typically required by conventional metrology devices. The vortex beam used by the optical metrology device may include a plurality of wavelengths so that spectral information may be acquired simultaneously with the polarization information. The vortex beam is focused on a sample under test over a large range of angles of incidence, which allows the multiple polarization measurements to be acquired at multiple angles of incidence simultaneously. The optical metrology device may use an image produced by the reflected vortex beam, e.g., from the back pupil plane of the object lens, to determine the polarization state of the reflected optical vortex beam as function of position of the angle of incidence and the azimuth angle, which may be further measured over a plurality of wavelengths. The polarization-state information detected over multiple angles of incidence, azimuthal angles, and wavelengths provides information with which an accurate determination of one or more characteristics of a sample may be determined.

In one implementation, an optical metrology device that is capable of determining a characteristic of a sample may include a polarization state generator that converts a light beam into an optical vortex beam. Metrology device may further include focusing optics that have an optical axis that is normal to a surface of the sample. The focusing optics focus the optical vortex beam on the sample over a plurality of angles of incidence and a plurality of azimuth angles that correspond to initial polarization states. A detector receives a reflected optical vortex beam from the sample in an image of a pupil plane of the focusing optics. The detector simultaneously measures polarization states of the reflected optical vortex beam based on multiple positions in the image of the pupil plane, each position differing in at least one of radius and azimuth angle, wherein the radius corresponds to the angle of incidence and the azimuth angle corresponds to initial polarization states from the optical vortex beam. At least one processor receives the image of the pupil plane from the detector and is configured to determine the characteristic of the sample using at least the polarization states of the reflected optical vortex beam.

In one implementation, a method of characterizing a sample using an optical metrology device, may include generating an optical vortex beam and focusing the optical vortex beam on the sample along an optical axis that is normal to a surface of the sample. The optical vortex beam is focused on the sample over a plurality of angles of incidence and a plurality of azimuth angles that correspond to initial polarization states. The method may further include measuring polarization states of a reflected optical vortex beam from the sample in an image of a pupil plane of the focusing optics based on multiple positions in the image of the pupil plane, each position differing in at least one of radius and azimuth angle, wherein the radius corresponds to the angle of incidence and the azimuth angle corresponds to the initial polarization states from the optical vortex beam. The characteristic of the sample is determined using at least the polarization states from the reflected optical vortex beam.

In one implementation, an optical metrology device that is capable of determining a characteristic of a sample may include a means for generating an optical vortex beam and a means for focusing the optical vortex beam on the sample along an optical axis that is normal to a surface of the sample. The optical vortex beam is focused on the sample over a plurality of angles of incidence and a plurality of azimuth angles that correspond to initial polarization states. The optical metrology device may further include a means for measuring polarization states of a reflected optical vortex beam from the sample in an image of a pupil plane of the focusing optics based on multiple positions in the image of the pupil plane, each position differing in at least one of radius and azimuth angle, wherein the radius corresponds to the angle of incidence and the azimuth angle corresponds to the initial polarization states from the optical vortex beam and a means for determining the characteristic of the sample using at least the polarization states from the reflected optical vortex beam.

BRIEF DESCRIPTION OF THE DRAWINGS

FIGS. 12A-12E illustrate configurations of the metrology device where various Mueller Matrix elements of the sample are measured from different combinations of input polarizations state from the polarization state generator (PSG) and the output polarization state analyzer (PSA).

FIG. 12F illustrates the 4×4 Mueller Matrix elements.

DETAILED DESCRIPTION

An optical metrology device is capable of measuring a plurality of polarization states at multiple angles of incidence and multiple wavelengths using a vortex beam of broadband light that includes azimuthally varying phase and/or polarization states. The vortex beam is focused on the sample over a large range of angles of incidence, e.g. using a normal incidence objective lens having a large numerical aperture. By imaging the back pupil plane of the objective lens, the polarization state of the reflected vortex beam may be detected as a function of radius (corresponding to angle of incidence) and azimuth angle (corresponding to initial polarization states of the vortex beam).

A polarization imaging detector may be used to simultaneously acquire multiple polarization states at each angle of incidence and azimuth angle. A hyperspectral imaging detector may be used to simultaneously acquire spectral information at each angle of incidence and azimuth angle. Additionally, with a linear polarizer before the hyperspectral imaging detector, polarization information may be obtained at each angle of incidence and azimuth angle.

The metrology device may be configured, e.g., with linear polarizers and waveplates, to acquire N, C, S components of the Mueller matrix. In some implementations, the metrology device may be configured to acquire the full Mueller matrix at multiple wavelengths in a single shot, i.e. captured image. The acquisition of polarization or phase information at multiple angles of incidence, azimuthal angles, and wavelengths enables more accurate film and index measurements as well as for more accurate determination of critical dimension (CD) structures due to the added constraints. For example, use of a full $2\pi$ azimuthal rotation around each angle of incidence enables the determination of sample anisotropies and provides added constraints for CD measurements.

Figure 1:
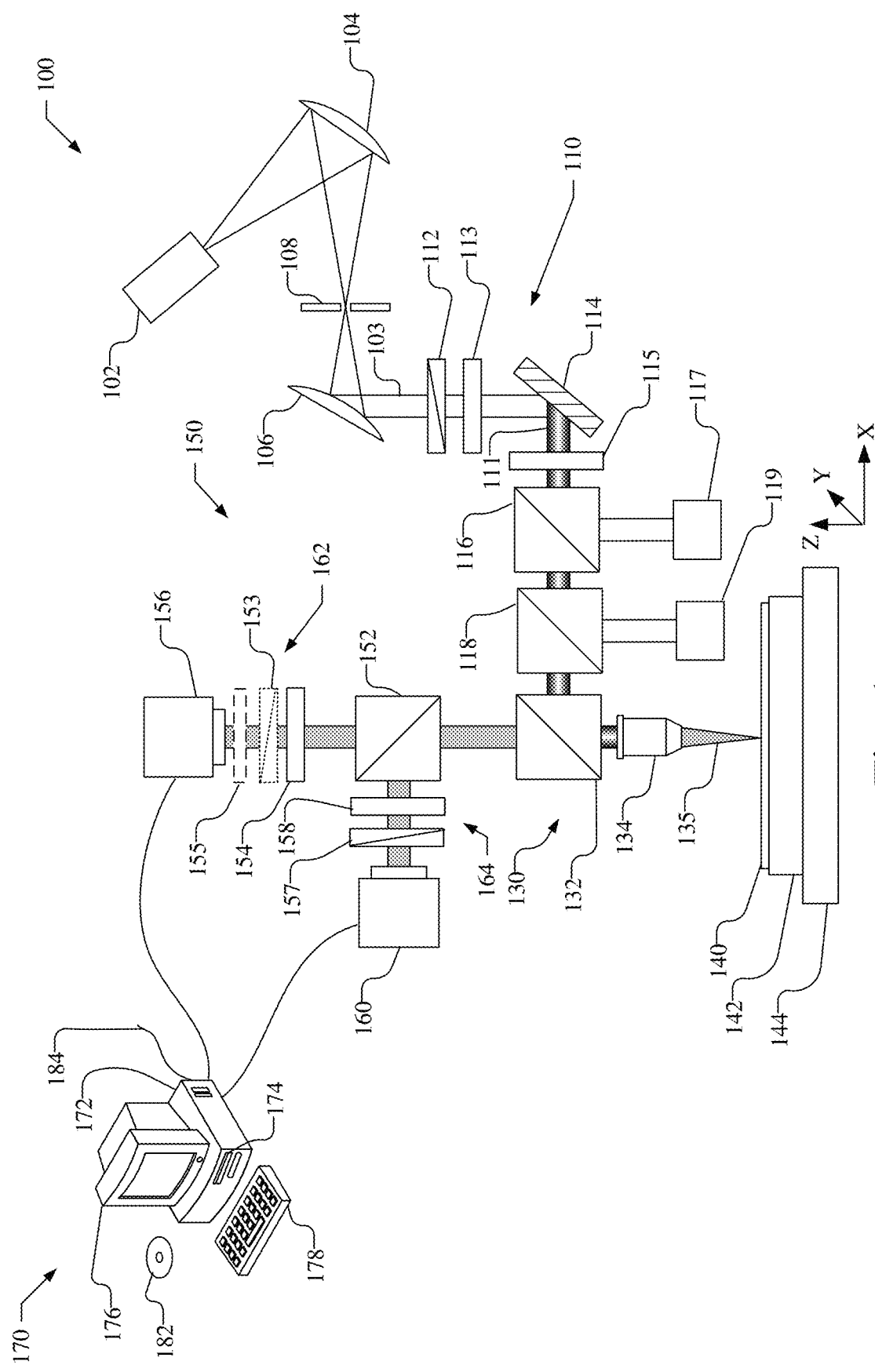
FIG. 1 illustrates an optical metrology device configured to determine a characteristic of a sample using an optical vortex beam.

FIG. 1 illustrates an optical metrology device 100 configured to determine a characteristic of a sample using a vortex beam. As illustrated, metrology device 100 includes a light source 102, which may be a broadband or multispectral light source that emits multiple wavelengths, e.g., in one or more wavelength bands, or a single wavelength. In some implementations, the light source 102 may produce multiple non-contiguous bands of wavelengths. In some implementations, the light source 102 may produce the multiple bands of wavelengths simultaneously, while in other implementations, the light source 102 may produce each of the multiple bands of wavelengths separately, e.g., within a short period of time. The light source 102 may have a low coherence to prevent speckle from appearing in detected images. A multispectral light source 102, for example, may include a bank of high brightness LEDs to match the center wavelength for each channel of a hyperspectral imager. In some implementations, the light source 102 may be a broadband frequency comb light source or a Fourier domain mode locked laser light source. In some implementations, a broadband continuum light source such as a lamp may also be used to produce multiple contiguous wavelengths, e.g., in a single wideband of wavelengths. For example, the light source 102 may be, a thermal (halogen) bulbs or high pressure arc-discharge plasma lamps. One or more optical components, illustrated by reflective lenses 104 and 106 and field stop 108, may be used to collimate the light 103 produced by the light source 102. The light 103 produced by the light source 102 may be a Gaussian beam.

The metrology device 100 includes an optical system configured to convert the light 103 produced by the light source into an optical vortex beam, e.g., a beam having azimuthally varying polarization states, or in some implementations azimuthally varying phase states. By way of example, the metrology device 100 may include a polarization state generator (PSG) 110 to produce the optical vortex beam 111. The PSG, for example, may include a polarizer 112 and a waveplate 113, e.g., quarter or half, in combination with an azimuthally varying retarder 114 to achieve the optical vortex beam.

A vortex beam allows all of the incident radiation to have the same polarization state for each azimuth angle, such as all S polarized for an azimuthally polarized beam or all P polarized for a radially polarized beam. Additionally, there are also options to vary the polarization states spatially through the azimuth angle. This would be equivalent to mapping the polarization state changes to azimuth angle rather than time as in the case of rotating element ellipsometry. Changing the polarization state through azimuth would produce symmetric quadrants for data analysis.

Figure 2:
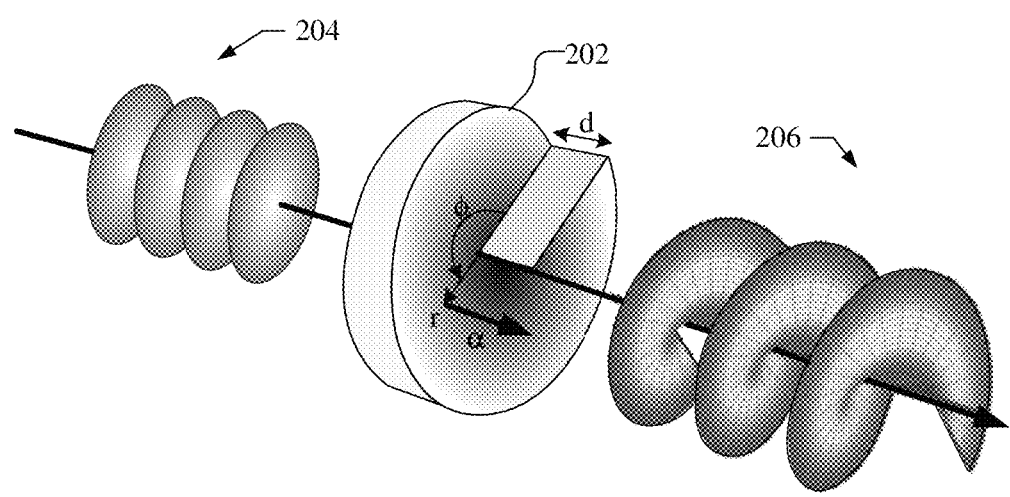
FIG. 2 illustrates generation of an optical vortex beam using a spiral phase plate.

FIG. 2 illustrates, by way of example, generation of an optical vortex beam using a spiral phase plate 202. A spiral phase plate is a spiral-shaped pieces of crystal or plastic that is engineered specifically to the desired topological charge and incident wavelength. As illustrated, a beam of light 204 with a fundamental, e.g., $TEM_{00}$, transverse Gaussian mode is incident on the spiral phase plate 202. The beam of light 204, for example, may be the light produced by light source 102 shown in FIG. 1. As illustrated, the spiral phase plate 202 transforms the Gaussian beam to a helical beam of light 206. The helical beam of light 206 may have azimuthally varying phase. The helical beam electrical field may have the generic form:

$$\psi = \alpha e^{im\phi} e^{-r^2} \qquad \text{eq. 1}$$

where $m*\phi$ is the helical phase, a is amplitude, m is the orbital angular momentum (OAM) quantum number, $\phi$ is the azimuthal angle with respect to the defect in the spiral phase plate 202, r is the radial position on the spiral phase plate 202, and d represents the optical path variation that gives rise to the $m*2\pi$ azimuthal phase variation.

Similar to the generation of the optical vortex beam using a spiral phase plate 202, the PSG 110, which may include the polarizer 112, waveplate 113, and the azimuthally varying retarder 114 may produce an optical vortex beam with polarization that varies as a function of the azimuthal angle.

Figure 3:
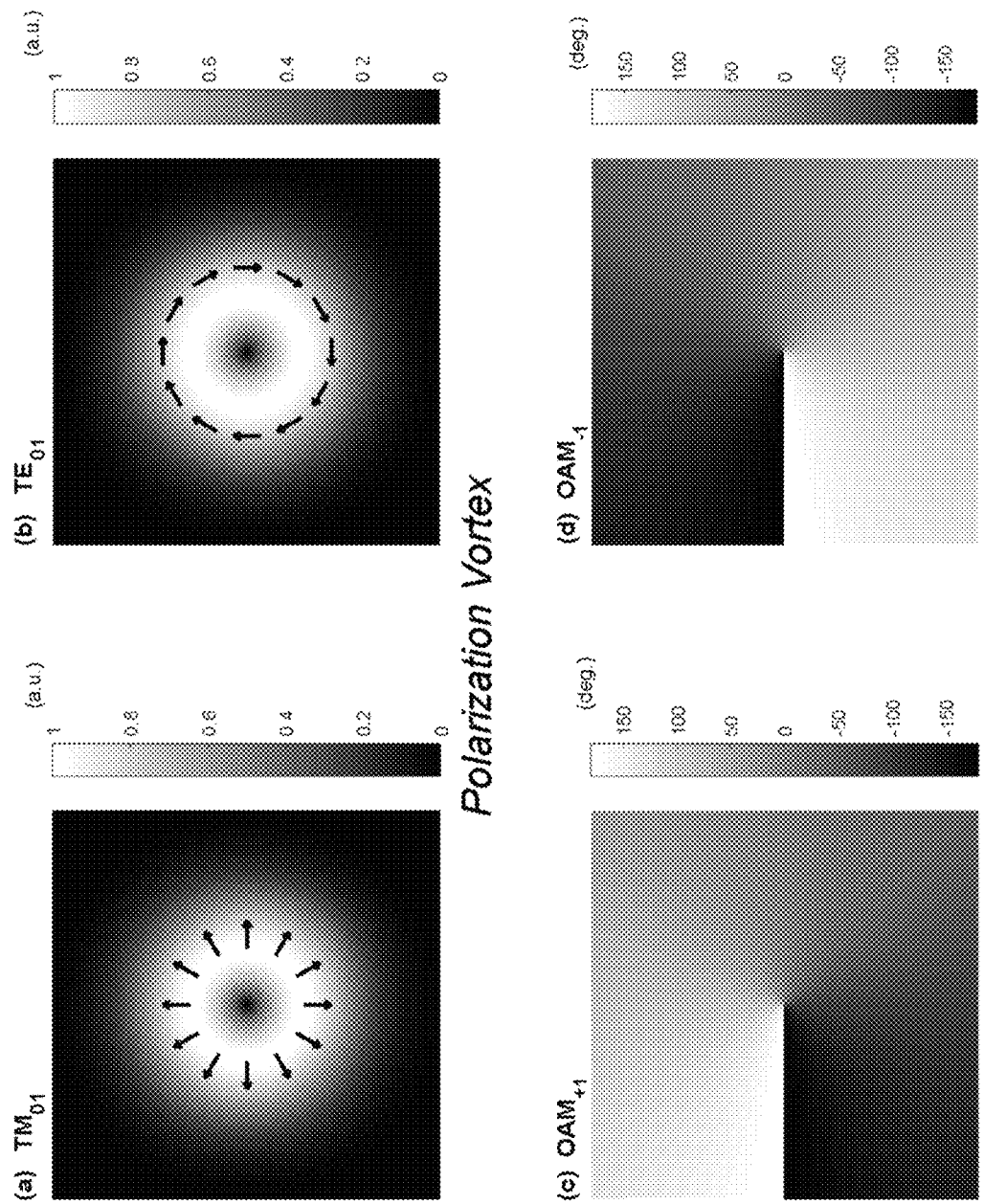
FIG. 3 illustrates projections of the helical beam of light with varying phase and polarization states.

FIG. 3 for example, illustrates cross-sections of the helical beam of light with varying phase and polarization states. As illustrated, the vortex beam forms an annulus of light with a central void of, e.g., approximately 5-10% of the beam diameter. The vortex beam may form a polarization vortex having $TM_{01}$ mode in diagram (a) or $TE_{01}$ mode in diagram (b), and a phase vortex having orbital angular momentum $OAM_{+1}$ in diagram (c) or $OAM_{-1}$ in diagram (d). The OAM quantum numbers or, topological charge, m ($\pm 1$, $\pm 2$, $\pm 3$ . . . ) defines how many $2\pi$ phase cycles occur to the electromagnetic field, of a given wavelength, along the azimuthal direction in the beam as per equation 1, Referring to FIG. 1, the azimuthally varying retarder 114, for example, may be an s-plate or a q-plate, which both have a topologic charge in which the local fast axis at a point (x,y) is oriented by q.A degrees, where A is the azimuth of the point (x,y), and the point (0,0) is the center of the vortex. An s-plate, for example, is a plate with birefringent structures permanently written into silica glass, e.g., using UV lithography, with an azimuthal variation in the fast axis with topological charge of s and is tuned to a single wavelength. A q-plate, for example, is a birefringent liquid crystal or polymer plate with an azimuthal distribution of the local optical axis, which has a topological charge q at its center defect. The q-plate with topological charge q can generate a +/−2q charge vortex based on the input beam polarization. The PSG 110 may include a waveplate 115, which may be a quarter waveplate or half waveplate, that modifies the polarized vortex beam 111 to provide a spatial modulation of the polarization states as a function of beam azimuth. It is noted that spiral phase plates (SPP), Q-plates (QO) and S-plates (SP) may sometimes operate in transmission mode at normal incidence. In such as configuration, element 114 may be a folding mirror and element 115 may be the azimuthally varying retarder operating in transmission mode.

In some implementations, the azimuthally varying retarder 114 may be a nematic spatial light modulator (SLM) that may be programmed as a topological q-plate. An SLM may be programed to display a hologram of varying spatial birefringence. If the retarder 114 is an SLM, the SLM may be programmed as a topological q-plate to vary the polarization or phase of the optical vortex beam 111 as a function of both beam azimuth and beam radius and the waveplate 115 may be omitted. The SLM retarder 114, thus, is variable with on-demand vortex reconfiguration.

Figure 4:
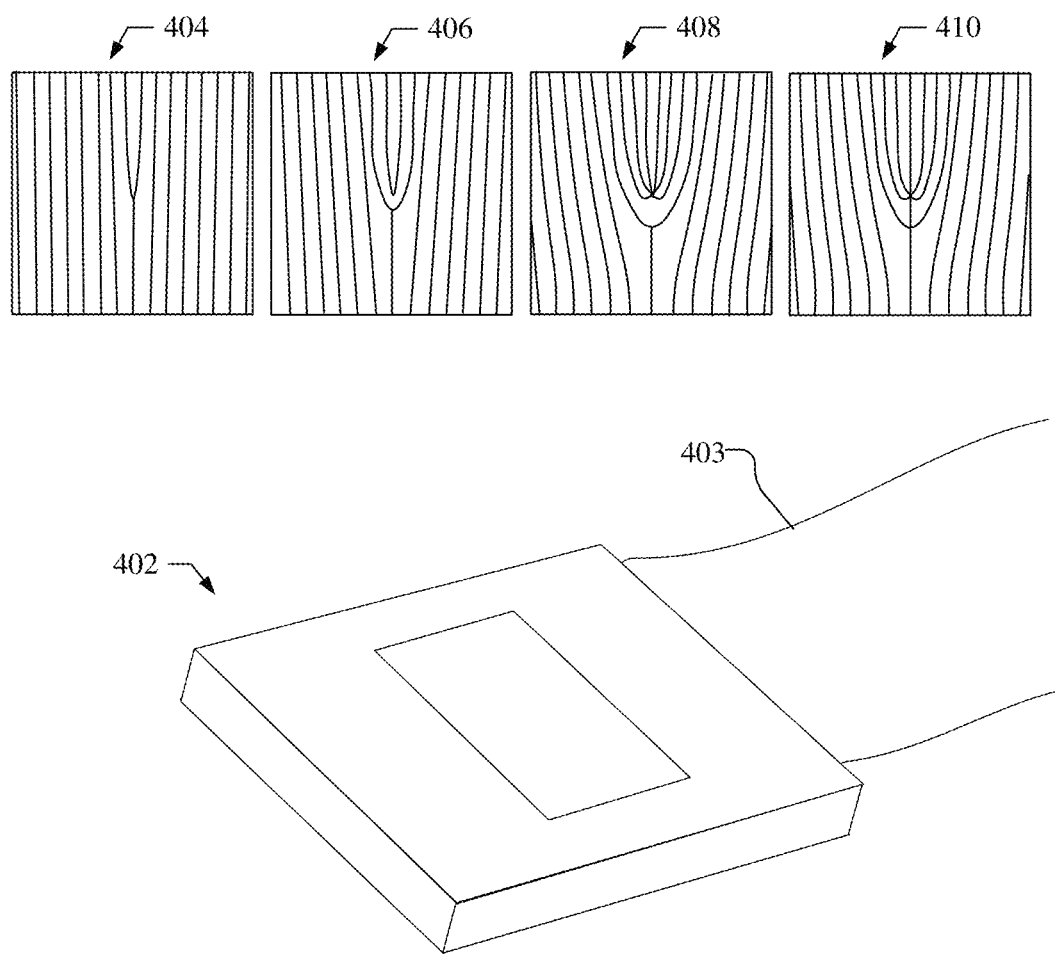
FIG. 4 illustrates a spatial light modulator that may be used as azimuthally varying retarder to produce the optical vortex beam.

FIG. 4, by way of example, illustrates an SLM 402 that may be used as azimuthally varying retarder 114. FIG. 4 additionally illustrates, by way of example, different topological q-plate structures 404, 406, 408, and 410, with which SLM 402 may be programmed via ribbon cable 403. The SLM 402 may create dynamic vortices, and arrays of vortices by creating a hologram of varying refractive indices. The hologram produced by SLM 402 is typically a spiral retardance pattern with non-zero topological charge (phase singularity) at the center and when viewed appears as a fork pattern. The SLM 402 may be programed to generate dynamic vortices, or arrays of vortices and may be tuned for broadband efficiency, and to compensate for systematic wave-front errors or other aberrations.

In some implementations, for broadband polarization control, if the azimuthally varying retarder 114 (shown in FIG. 1) is an SLM, the SLM may be programmed to provide a holographic grating that changes as a function of wavelength. Different spectral bands may be processed serially using the SLM retarder 114 tuned to each specific wavelength.

Additionally, in some implementations, if the azimuthally varying retarder 114 is an SLM, the SLM may also be used to provide aberration corrections, e.g., corrections to non-ideal vortex beams. The aberration correction by the SLM retarder 114 may be used to compensate for systematic differences between systems and within a system itself. The error between the ideal vortex beam and the aberrated beam may be minimized by addressing the hologram on the SLM retarder 114.

In some implementation, if there is some efficiency of conversion to a vortex beam at the desired wavelengths that is less than unity, the quarter waveplate 115, which may be a Fresnel Rhomb, may be used with a linear polarizing beam splitter 116 to clean up the beam by rejecting the Gaussian beam and passing the vortex beam. For example, the efficiency of the azimuthal retarder 114 may vary at different wavelengths, resulting in a portion of the light 103, which may be a Gaussian beam, passing the azimuthal retarder 114 at different wavelengths. The quarter waveplate 115 and the linear polarizer 116 operate as a polarization-sensitive phase noise filter. For example, the quarter waveplate 115 shifts the phase modulation pattern in the vortex beam 111 azimuthally to an orientation that passes the subsequent polarizer 116. Random phases are shifted to an identically random ensemble of phases and are rejected by the polarizer 116 and directed to beam dump 117.

In some implementations, a beam splitter 118 may be used to direct a portion of the vortex beam 111 towards a spectrometer 119 to generate a reference spectrum.

Metrology device 100 includes a focusing optics 130, illustrated as a beam splitter 132 and an objective lens 134 to direct and focus the vortex beam 111 on the sample 140 that is held on a chuck 142. The objective lens 134 may be a normal incidence infinity corrected refractive or reflective objective lens. For example, in one implementation, an objective lens 134 may be Schwarzschild objective lens. The optical axis of the objective lens 134 may be normally incident on the sample 140, the objective lens 134, however, may have a large numerical aperture, e.g., 0.8-0.95 NA, to produce an incident beam 135 with a large range of angles of incidence (AOI) and azimuthal angles. For example, the NA of the objective lens 134 may be sufficient to illuminate the sample for azimuth measurements through a $2\pi$ rotation and an AOI range from 0° to 72° or greater. It should be understood, however, that with the use of the vortex beam, which includes a central void, the sample 140 will be illuminated with an AOI between approximately 8° to 72°. The use of a normal incidence high numerical aperture objective lens 134 allows for both a small footprint and high angles of incidence that would typically require a larger footprint for techniques such as ellipsometry. Moreover, ellipsometry measurements are enabled with metrology device 100 without moving polarizers, through normal incidence.

The multispectral or single wavelength vortex beam 111 is incident at the back aperture of the objective lens 134 enabling multispectral vortex polarimetry. The pupil of the objective lens 134 maps the azimuthal and AOI positions of the vortex beam 111 onto the sample 140. The specular reflection will return the beam to a position with the same spatial frequency in the opposite quadrant of the pupil of the objective lens 134. The X and Y spatial frequencies will have a negative multiplier to map the incident light to the reflected light. Scattering from the sample, e.g., due to grating structures, may also show up as structure in a pupil image, which may be used as an additional constraint to determine the sample, e.g. grating, structure.

The chuck 142 on a stage 144 capable of motion to produce relative motion between the sample 140 (held on the chuck 142) and the focusing optics 130 of the metrology device 100 so that measurements may be performed at a plurality of different locations of the sample 140. For example, the stage 144 may move the sample 140 linearly, e.g., within the Cartesian coordinate plane (X,Y) directions, or may rotate and linearly move the sample 140, e.g., in Polar coordinate plane (R, Theta). If desired, the stage 144, one or more optical elements of the metrology device 100, or both may both be moved to produce the relative motion between the stage and the focusing optics 130. For example, the stage 144 may rotate while more optical elements of the metrology device 100 move linearly. The stage 144 or optical elements of the metrology device 100 may further be capable of vertical (Z) motion, e.g., for focusing.

The metrology device 100, operating as a hyperspectral vortex polarimeter has the capability to be rotationally invariant in certain operation modes. This would provide additional benefits if the stage 144 is an R/Theta stage, because the symmetry of the measurement beam would not require polarizers to be rotated to match the stage rotation. For instance, all S or all P polarizations could be incident at the sample through all AOIs and azimuth angles.

The reflected light from the sample 140 returns via the objective lens 134 and beam splitter 132 and is directed to a detector arm 150. In the detector arm 150 one or more detectors receive the reflected optical vortex beam from the sample 140 in an image of the pupil plane of the objective lens 134. Each of the one or more detectors may simultaneously measure a characteristic of the reflected vortex beam as a function of position of the angle of incidence and azimuth angle. The characteristic of the reflected vortex beam may be, for example, the polarization state of the reflected vortex beam as a function of position of the angle of incidence and azimuth angle or spectral information for the reflected vortex beam at each of the plurality of the angles of incidence, plurality of the azimuth angles and the plurality of wavelengths. For example, the detector arm 150 may include a polarization imaging detector 156 or a hyperspectral imaging detector 160 or may include both a polarization imaging detector 156 and a hyperspectral imaging detector 160. For example, as illustrated in FIG. 1, a portion of the light returned from the sample 140 is directed by a second beam splitter 152 to a polarization imaging detector 156 and another portion of the light returned from the sample 140 is directed to the second beam splitter 152 to a hyperspectral imaging detector 160. If only one detector is present in the detector arm 150, the second beam splitter 152 would not be necessary. One or more optical elements may be located in the beam path before the one or more detectors 156 and 160. For example, before the hyperspectral imaging detector 160 there may be a retarder 158, which may be stationary or may rotate, and may be a quarter or half waveplate. A linear polarizer 157 may be located between the detector 160 and the retarder. The linear polarizer 157 may be stationary or may rotate. One or more of the polarizer 157 and retarder 158 may be sometimes referred to as a polarization state analyzer (PSA) 164. Before the polarization imaging detector 156, there may be a retarder 154, which may rotate, and which may be a quarter or half waveplate. If the detector 156 is not a polarization imaging detector 156, but is a two dimensional sensor, then there may be either a polarizer 153 (shown with dotted lines), which may rotate, between the beam splitter 152 and the detector 156, or both the retarder 154 and the polarizer 153, with the polarizer 153 between the retarder 154 and the detector 156. In the last configuration, one or both of the retarder and polarizer 153 may rotate. If the detector 156, however, is a polarization state detector 156, then polarizer 153 is not necessary (as indicated by the dotted lines). One or more of the retarder 154, the polarizer 153 or the polarization state detector 156 may be sometimes referred to as a polarization state analyzer (PSA) 162. Additional elements may be present as well, such as a wavelength separator 155, such as a color filter, before the polarization imaging detector 156, as well lenses and aperture stops (not shown). With the polarization imaging detector 156 and the hyperspectral imaging detector 160, measurement acquisition is fast as measurements may be obtained in single shot images or as a limited number of shot acquisitions, e.g. to obtain multiple wavelengths using the polarization imaging detector 156, thereby improving throughput.

The polarization imaging detector 156 receives the reflected optical vortex beam from the sample 140 as imaged at the pupil plane of the objective lens 134. The polarization imaging detector 156 simultaneously measures multiple polarization states of the reflected vortex beam as a function of position of the angle of incidence and azimuth angle.

Figure 5:
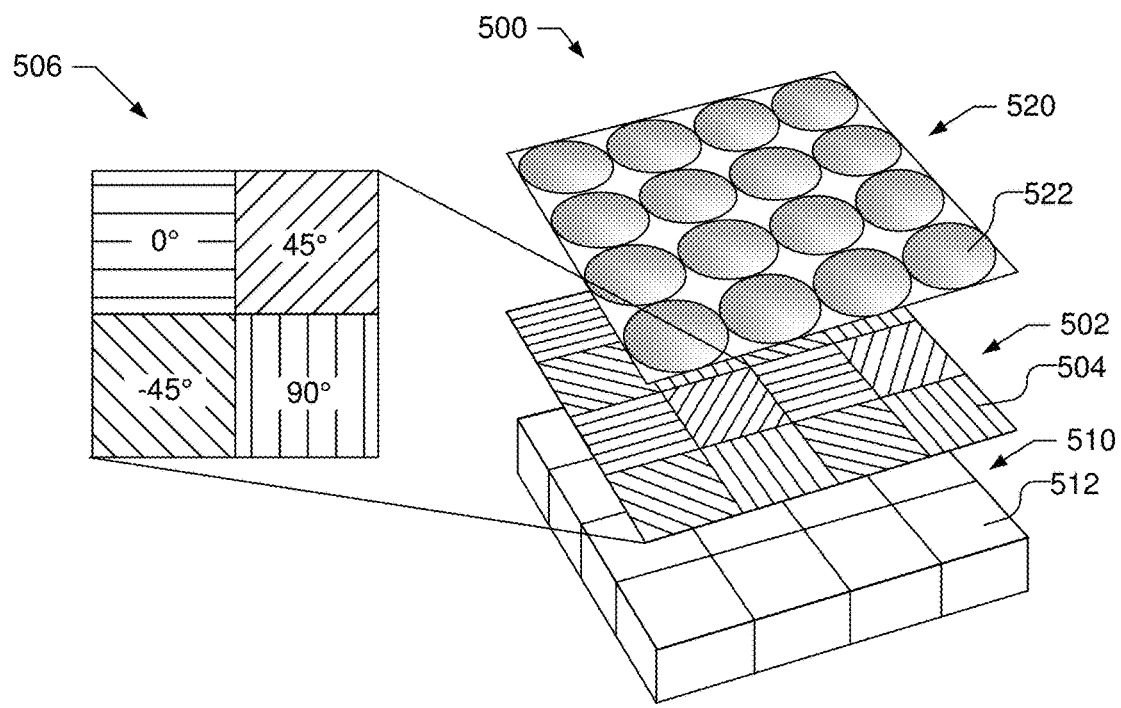
FIG. 5 illustrates a perspective view of a polarization imaging detector.

FIG. 5 illustrates an example of a polarization imaging detector 500, which may be used as polarization imaging detector 156 in metrology device 100. The polarization imaging detector 500, for example, may be an imaging polarimeter camera, for example, produced by Lucid Vision Labs, Inc. or Thorlabs, Inc using a sensor produced by Sony. The polarization imaging detector 500 includes a micropolarizer array 502, which is aligned with a two-dimensional sensor 510. The micropolarizer array 502 is an array of wire grid polarizers 504 having a number, e.g., four, polarization orientations. Each polarizer 504 in the micropolarizer array 502 is aligned with a pixel 512 in the two-dimensional sensor 510. Additionally, the polarization imaging detector 500 may include a microlens array 520, with each lens 522 aligned with a separate polarizer 504 and pixel 512.

Figure 6:
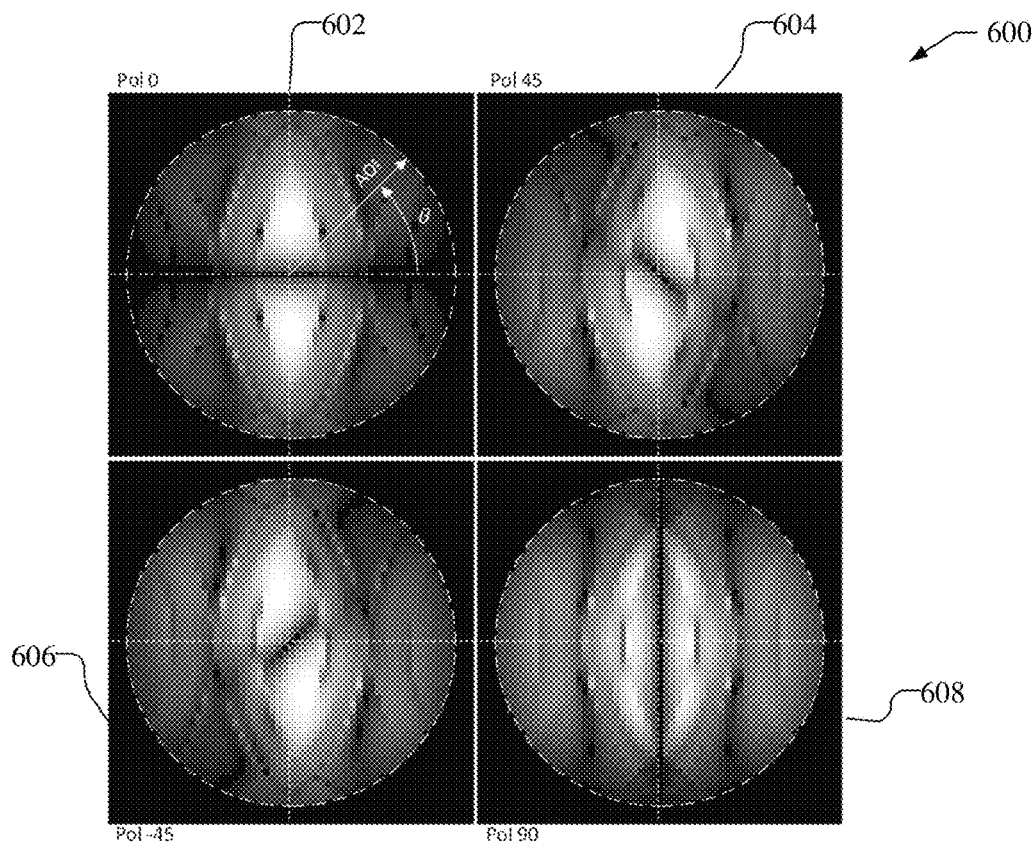
FIG. 6 illustrates a set of images produced by a reflected vortex beam that may be simultaneously acquired by a polarization imaging detector at a different polarization states.

The polarization imaging detector 500 may be defined as an array of macro pixels, with each macro pixel including a number of pixels having wire grid polarizers 504 with different polarization states aligned with detector pixels 512. For example, as illustrated in FIG. 5, a macro pixel 506 may be defined as a 2×2 array of pixels having 4 different polarization states, e.g., 0°, 45°, −45°, and 90°. The polarization imaging detector 500 may include a 227×227 macro-pixel array to image of the full $2\pi$ of azimuths and from having an effective AOI range from ~8° to ~72°, i.e. providing a resolution of approximately 0.6° of AOI per macro-pixel FIG. 6 illustrates, by way of example, a set of four images 600 based on a simulation of the vortex polarimeter on an oxide grating on Si, of 360 nm pitch and lines 180 nm width and 200 nm high that is simultaneously captured by polarization imaging detector 500, each image 602, 604, 606, 608 is produced at a different polarization state, e.g., 0°, 45°, −45°, and 90°, and including the full $2\pi$ of azimuths and from having an effective AOI range from ~8° to ~72°. The polarization imaging detector 500 permits the polarization of the reflected vortex beam to be measured as a function of AOI and azimuth angle. With the polarization imaging detector 500 having macro-pixels that include multiple polarization orientations, and the vortex beam, ellipsometry measurements are enabled without moving polarizers.

Referring to FIG. 1, the polarization imaging detector 156 may include a wavelength separator 155, such as a color filter, to select a single wavelength or a narrow band of wavelengths, for imaging. In another example, the wavelength separator 155 may temporally separate the multiple wavelengths in the reflected vortex beam, e.g., where multiple wavelengths are produced by light source 102 simultaneously or sequentially. For example, the wavelength separator 155 may be scanning monochromator or an acousto-optic tunable filter that separates wavelengths in the reflected vortex beam (using diffraction in this instance) into narrow bands of wavelengths and quickly switches between each band, e.g., minimum switching time is 200 ns, and the polarization imaging detector 156 captures images in each band of wavelength over time. A wavelength separator 155 may temporally separate wavelengths in other manners. For example, other types of tunable filters, similar to acousto-optic tunable filters may be used. In another implementation, the light source 102 may produce multiple wavelengths sequentially, e.g. by cycling on and off, shuttering, as a frequency comb, etc., and the polarization imaging detector 156 may capture images at high speed synchronized with the light source 102 to collect multiple frames, each frame representing a wavelength.

In addition or alternative to the polarization imaging detector 156, the metrology device 100 may include a hyperspectral imaging detector 160 that receives the reflected optical vortex beam from the sample 140 as imaged at the pupil plane of the objective lens 134 and simultaneously measures spectral information for the reflected vortex beam at each of the plurality of the azimuth angles and the plurality of wavelengths.

Figures 7, 8:
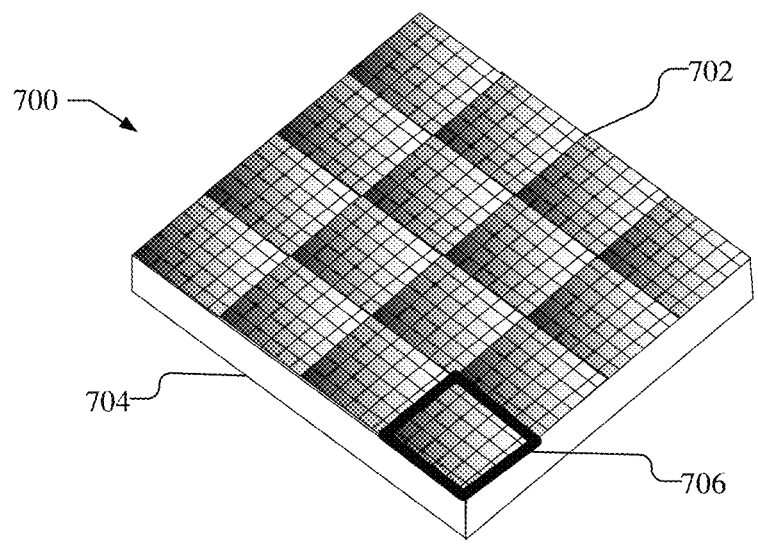
FIG. 7 illustrates a perspective view of a hyperspectral imaging detector.
FIG. 8 illustrates a top plan view of a single macro cell of a hyperspectral imaging detector.

FIG. 7 illustrates a perspective view of an example of a hyperspectral imaging detector 700, which may be used as hyperspectral imaging detector 160 in metrology device 100. The hyperspectral imaging detector 700, for example, may be a hyperspectral sensor produced by Interuniversity Microelectronics Centre (IMEC), or produced by Ximea as the xiSPEC, or Cubert as the Firefleye. The hyperspectral imaging detector 700 includes an array of spectral filters 702, each of which is aligned with a pixel in an underlying sensor 704. The hyperspectral imaging detector 700, for example, may include an array of macro-pixels 706, each of which includes a plurality of spectral resolving pixels. For example, each macro-pixel may by a 9×9 array of pixels, each resolving a different spectral range, e.g., from 350 nm to 700 nm, and one pixel resolving white light. If desired, the hyperspectral imaging detector 700, for example, may detect up to 100 discrete wavelengths, e.g., (350 nm-1700 nm) per shot. The hyperspectral imaging detector 700 may include a 227×227 macro-pixel array that the pupil image is mapped to. The center of the array is zero and the AOI increases radially away from the center to, e.g., 72°, with 0.6° per micropixel (i.e., 72°/113). In some implementations, multiple hyperspectral imaging detectors may be used, e.g., with dichroic beam splitters, used to direct different spectral ranges to separate hyperspectral imaging detectors to increase spectral and/or spatial resolution.

FIG. 8 illustrates a top plan view of a macro pixel 706 including a number of pixels that resolve different spectral ranges as identified and one pixel 708 that is unfiltered, i.e., collects the full wavelength range. By collecting the wavelengths with hyperspectral imaging detector 700 as a function of space instead as a function of time (e.g., with a rotating color filter wheel), the speed of measurement is increased, but only a fraction (by area) of the total signal at each wavelength is detected. With the use of unfiltered pixel 708 in each macro cell, a reference is provided for a scalable total intensity measurement at each macro-pixel (AOI). The area average of the intensities of all wavelengths in each macro-pixel should equal the reference pixel intensity. In addition, or alternatively, the reference spectrum produced by the spectrometer 119 (shown in FIG. 1) may be used as a reference.

Additionally, if the light source 102 (shown in FIG. 1) includes individually addressable spectral channels that are matched to the detectable bandwidths of the hyperspectral imaging detector 700, the light source 102 may be controlled to illuminate the sample using each channel separately. Using each color image and the reference pixel, the normalization may be spatially calibrated to selectively increase signal to noise (SNR) at each detection channel without overexposing the sample 140.

Figure 9:
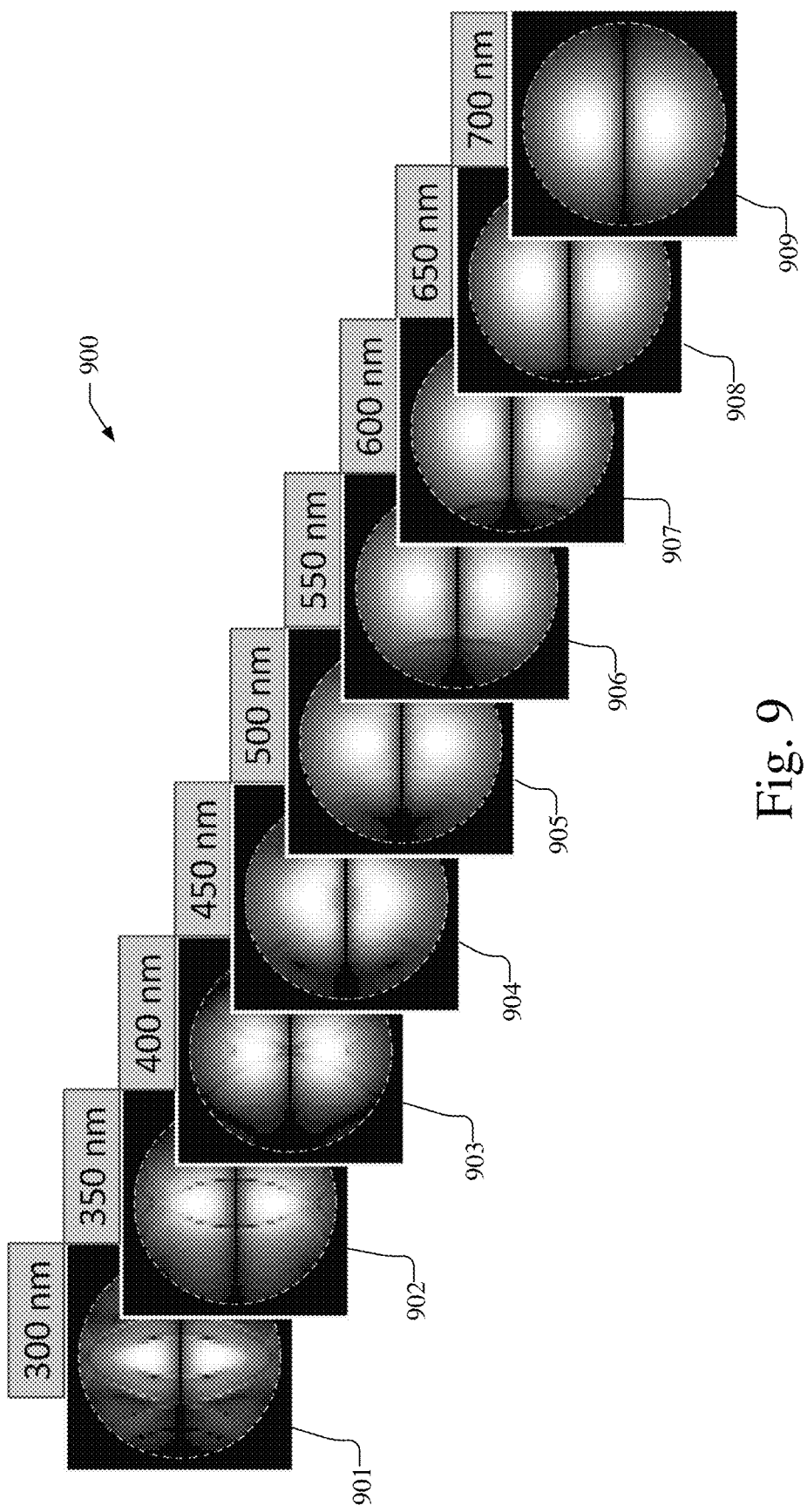
FIG. 9 illustrates a set of images produced by a reflected vortex beam that may be simultaneously acquired by a hyperspectral imaging detector.

FIG. 9 illustrates, by way of example, a set of images 900 based on a simulation of the vortex polarimeter on an oxide grating on Si, of 360 nm pitch and lines 180 nm width and 200 nm high that is simultaneously captured by hyperspectral imaging detector 700, each image 901, 902, 903, 904, 905, 906, 907, 908, and 909 at a different wavelength, and including the full $2\pi$ of azimuths and from having an effective AOI range from ~8° to ~72°. The hyperspectral imaging detector 700 permits spectral information for the reflected vortex beam to be measured as a function of AOI and azimuth angle.

Detectors in the detector arm 150, e.g., the polarization imaging detector 156 and the hyperspectral imaging detector 160, are coupled to a computer system 170, such as a workstation, a personal computer, central processing unit or other adequate computer system, or multiple processors. The computer system 170 is preferably included in, or is connected to or otherwise associated with metrology device 100. The computer system 170 may control the movement of the stage 144 and collect and analyzes the data obtained from the detectors 156 and 160 as discussed herein. For example, the reflected image from the pupil of the objective lens 134 may be analyzed using spectral and/or polarization information, e.g., using modeling. Moreover, the spectral and/or polarization information from the reflected vortex beam with respect to angle of incidence and/or azimuthal angle may be analyzed. For example, adding information channels in both azimuth and AOI provides additional constraints for solving critical dimension (CD) and film structures, improving thin film sensitivity. The hyperspectral vortex beam provides increased information due to the imaging of the full $2\pi$ of azimuths and from having an effective AOI range from ~8° to ~72° with multiple color channels. The use of 1-D beam profile reflectometry (BPR), for example, allows for accurate determination of dispersion models. The multiple AOIs may allow for more accurate film and index measurements as well as for more accurate determination of CD structures due to the added constraints. The full $2\pi$ rotation of AOIs around the azimuth direction may further allow for the determination of sample anisotropies and provide added constraints for CD measurements. Some vortex modes, for example, provide thin film sensitivity at higher AOIs, without requiring deep ultraviolet (DUV) wavelengths. The improved measurement sensitivity using hyperspectral vortex polarimetry, for example, has applications and utility in the integrated chemical mechanical polish (CMP) market, and other markets.

The computer system 170 may analyze the image data to determine one or more physical characteristics of the sample 140. The computer system 170 includes at least one processor 172 with memory 174, as well as a user interface including e.g., a display 176 and input devices 178. A non-transitory computer-usable storage medium 182 having computer-readable program code embodied may be used by the least one processor 172 to operate as a special purpose computer programmed to perform the techniques disclosed herein. The data structures and software code for automatically implementing one or more acts described in this detailed description can be implemented by one of ordinary skill in the art in light of the present disclosure and stored, e.g., on a computer-usable storage medium 182, which may be any device or medium that can store code and/or data for use by a computer system such as the least one processor 172. The computer-usable storage medium 182 may be, but is not limited to, magnetic and optical storage devices such as disk drives, magnetic tape, compact discs, and DVDs (digital versatile discs or digital video discs), and memory. A communication port 184 may also be used to receive instructions that are used to program the least one processor 172 to perform any one or more of the functions described herein and may represent any type of communication connection, such as to the internet or any other computer network. The communication port 184 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Thus, the determined one or more physical characteristics of the sample 140 may be determined by the computer system 170 and may be communicated and stored, e.g., in memory or in a database. The sample characteristics may be communicated to adjust one or more process tools associated with particular fabrication process steps in the fabrication sequence (e.g., process tools responsible for or contribute to the sample characteristic or to adjust the fabrication sequence of the sample itself.

Figure 10:
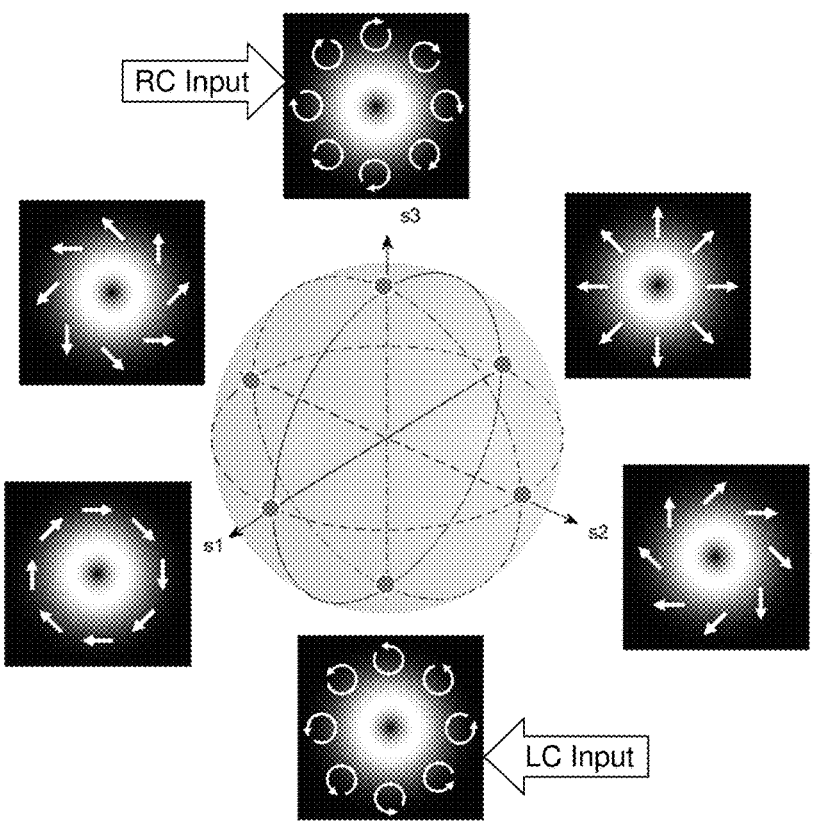
FIG. 10 illustrates a Poincare sphere and various polarization states possible in the vortex beam achieved using left circular (LC) and right circular (RC) polarized input light.
Figure 11:
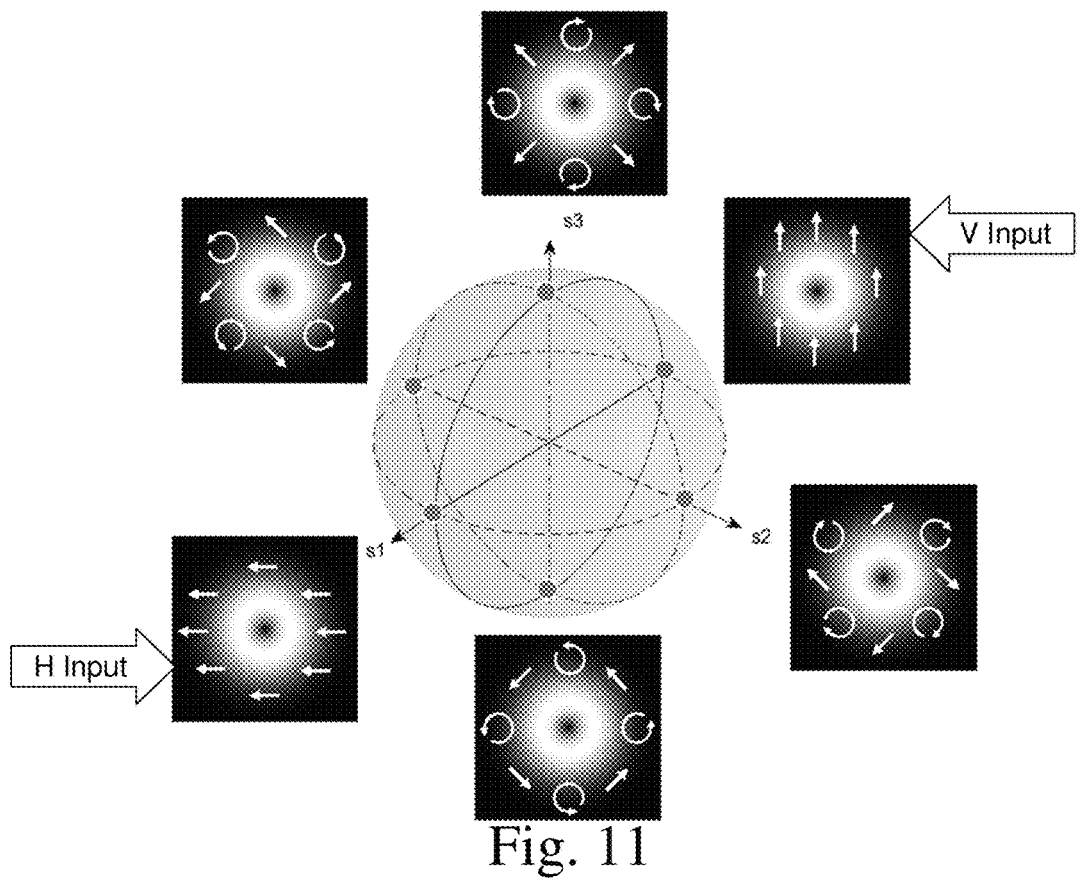
FIG. 11 illustrates a Poincare sphere and various polarization states possible in the vortex beam achieved using vertically (V) and horizontally (H) polarized input light.

With the use of various optical elements, the metrology device 100 may be configured to produce multiple different vortex polarimeter configurations. For example, as illustrated as with the Poincare sphere illustrated in FIG. 10, using left circular (LC) or right circular (RC) polarized input light, e.g., by polarizer 112 and waveplate 113, various polarization states off the meridian of the Poincare sphere may be achieved with metrology device 100. Similarly, as illustrated in FIG. 11, using linear, e.g., vertical and horizontal, polarized input light, e.g., by polarizer 112, additional various polarization states off the meridian of the Poincare sphere may be achieved with metrology device 100. Thus, the metrology device 100 enables a large number of polarization states of the vortex beam using a simple configuration of polarizer 112 and waveplate 113. In other words, an arbitrary polarization state may be produced for all azimuthal angles and AOIs, and the polarization states may vary over the azimuthal angles.

FIGS. 12A-12E illustrates configurations of the metrology device 100 where various Mueller Matrix elements of the sample are measured from different combinations of input polarizations state from the polarization state generator (PSG) 110 and the output polarization state analyzer (PSA) 162. FIG. 12F illustrates the 4×4 Mueller Matrix elements for reference.

Figure 12A:
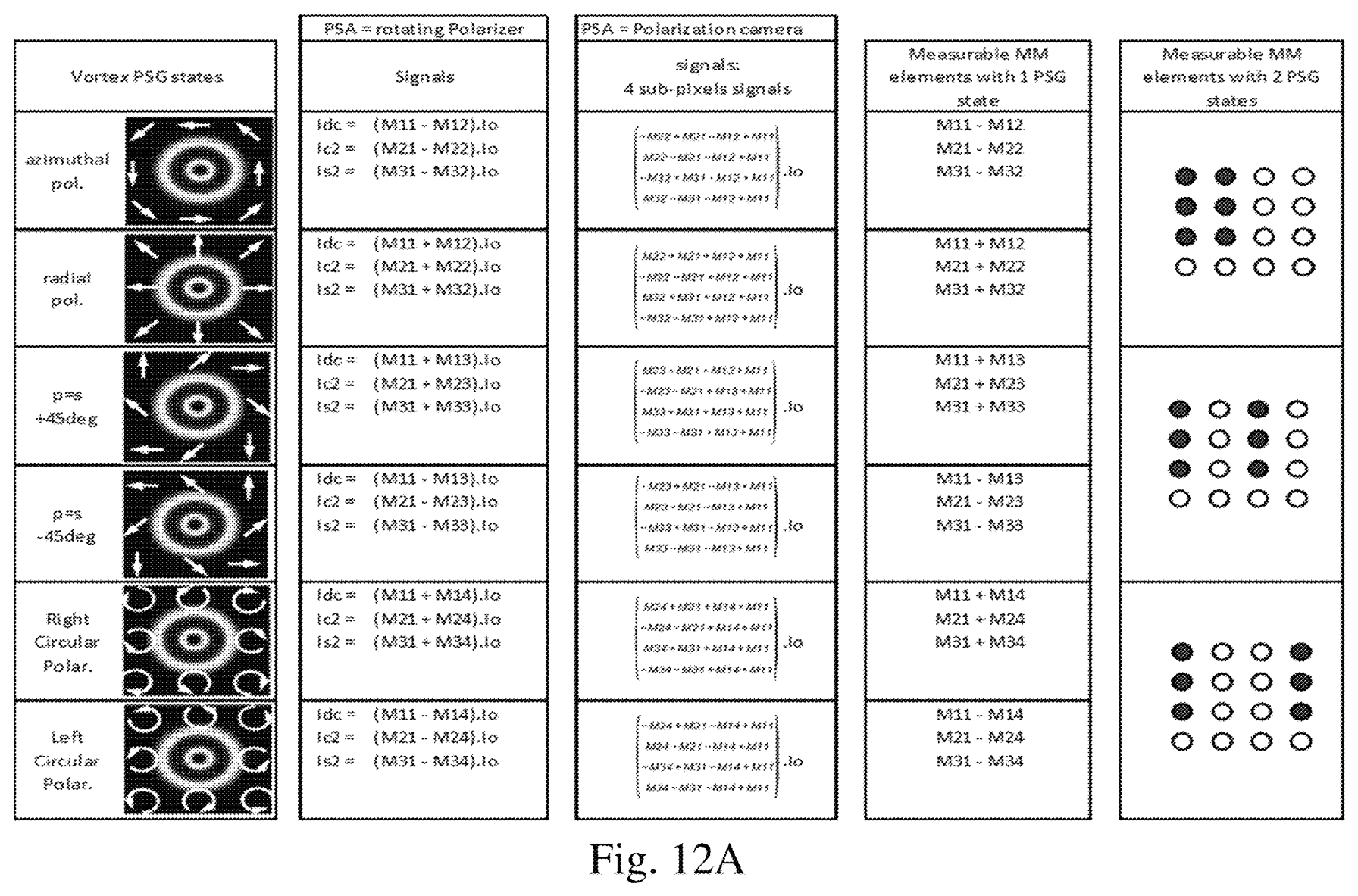

FIG. 12A, for example, illustrates the measurable MM elements for a sample, or combination of those MM elements, from different polarization states induced by the PSG 110 and for different configurations of the PSA, which may be PSA 162 or 164, shown in FIG. 1. For each PSG state in the first column (labeled Vortex PSG states), FIG. 12A shows the signals for the case where the PSA is a rotating polarizer (e.g., where the detector is a two dimensional sensor) (column 2) and where the PSA is a polarization state camera 156 (column 3). Column 4 shows the measurable combinations of the MM elements (sum and subtractions of two elements) for the sample 140 with respect to PSG states and PSA configurations (illustrated with aligned rows). Column 5 shows the measurable individual MM elements of the sample 140 with respect to PSG states and PSA configurations (illustrated with aligned rows) when 2 PSG states are used; where the 4×4 matrix of circles represent the MM elements, with the black circle indicating measured MM elements.

In the case where the PSA 162 is a rotating polarizer 153, the detector 156 may be a simple 2D sensor (and not a polarization state camera), and retarder 154 is not used. Alternatively, the detector may be the hyper-spectral camera 160 and the rotating polarizer may be polarizer 157, and retarder 158 is not used. A rotating polarizer PSA is typically operated by continuously rotating the polarizer and acquiring N signals over N slices of a full rotation. The polarizer may also be operated by steps of move-and-stop and N signals are acquired for the N angles of the polarizer. Those signals are then processed by Fourier Transform to obtain the "DC", the "cosine(2w)" and the "sin(2w)" components, denoted Idc, Ic2 and Is2 in FIG. 12A. If desired, to obtain Idc, Ic2 and Is2, other algorithms may be used instead of Fourier Transform, as will be clear to those of ordinary skill in the art. The symbol "Io" is effectively the source intensity, i.e. DC the signal seen by the detector if the sample 140 were a perfect mirror. Io is typically obtained in a preliminary calibration procedure for the device 100.

In the case where the PSA is the polarization state camera 156 (column 3), then only the polarization state camera 156 is used, and the polarizer 153 and retarder 154 are not used.

Figure 12B:
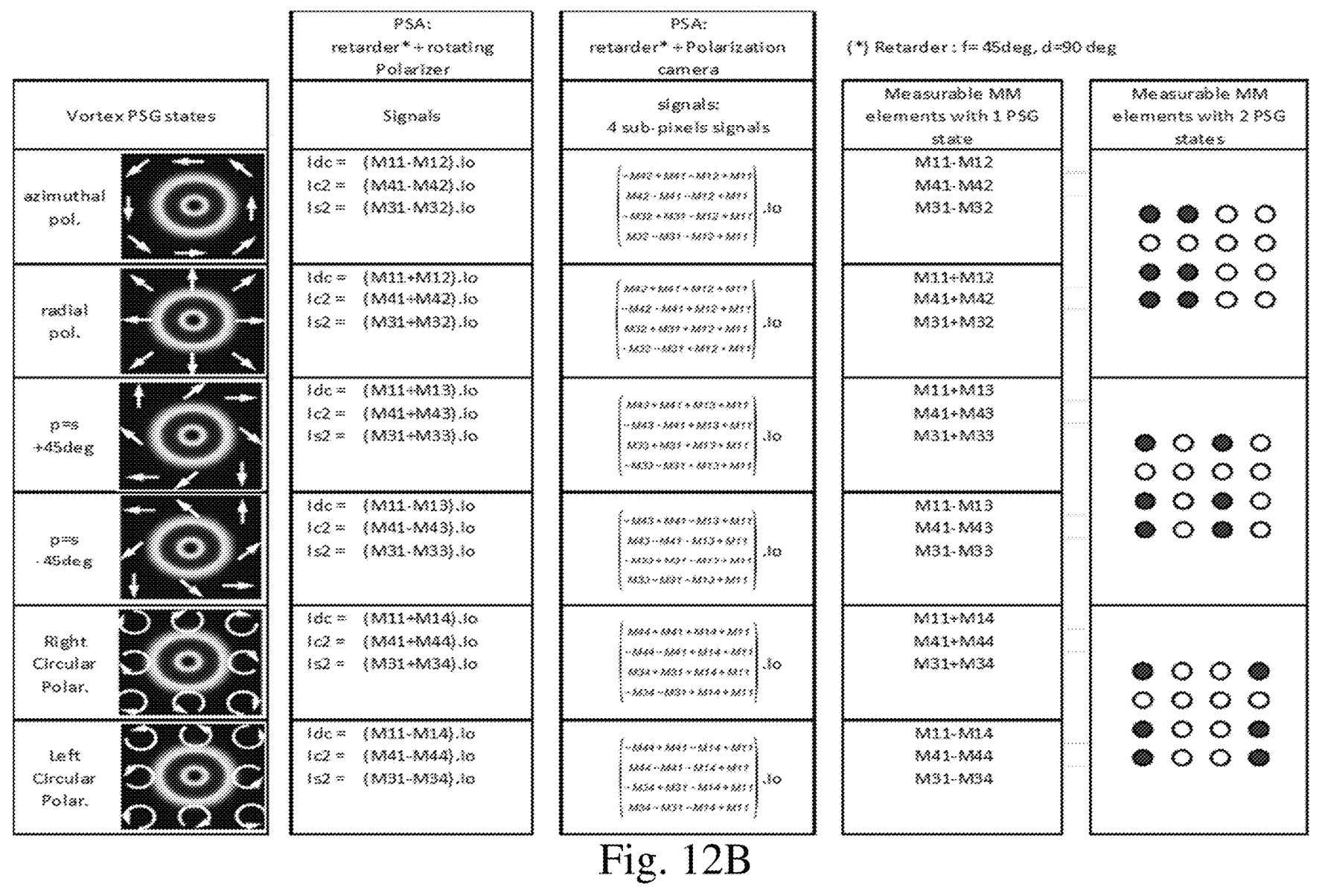

FIG. 12B, for example, is similar to FIG. 12A, and illustrates the measurable MM elements for a sample, or combination of those MM elements, from different polarization states induced by the PSG 110 and for different configurations of the PSA, which may be PSA 162 or 164, shown in FIG. 1. In FIG. 12B, unlike in FIG. 12A, the PSA includes a fixed retarder 154, 158 before the rotating polarizer 153, 157 or, alternatively, a retarder 154 before the polarization state camera 156. The retarder is ¼ waveplate (d=90 deg) with the fast axis at 45 deg (f=45 deg). Column 2 of FIG. 12B illustrates the case with a PSA is a retarder and a rotating polarizer. For example, the PSA may include a fixed retarder 154 and rotating polarizer 153, before the detector 156, which may be a 2D-sensor. Alternatively, the PSA may include a fixed retarder 158 and rotating polarizer 157 before the hyper-spectral camera 160. Column 3 of FIG. 12B illustrates the case with a PSA that includes the polarization state camera 156 with the retarder 154, and without the polarizer 153.

Figure 12C:
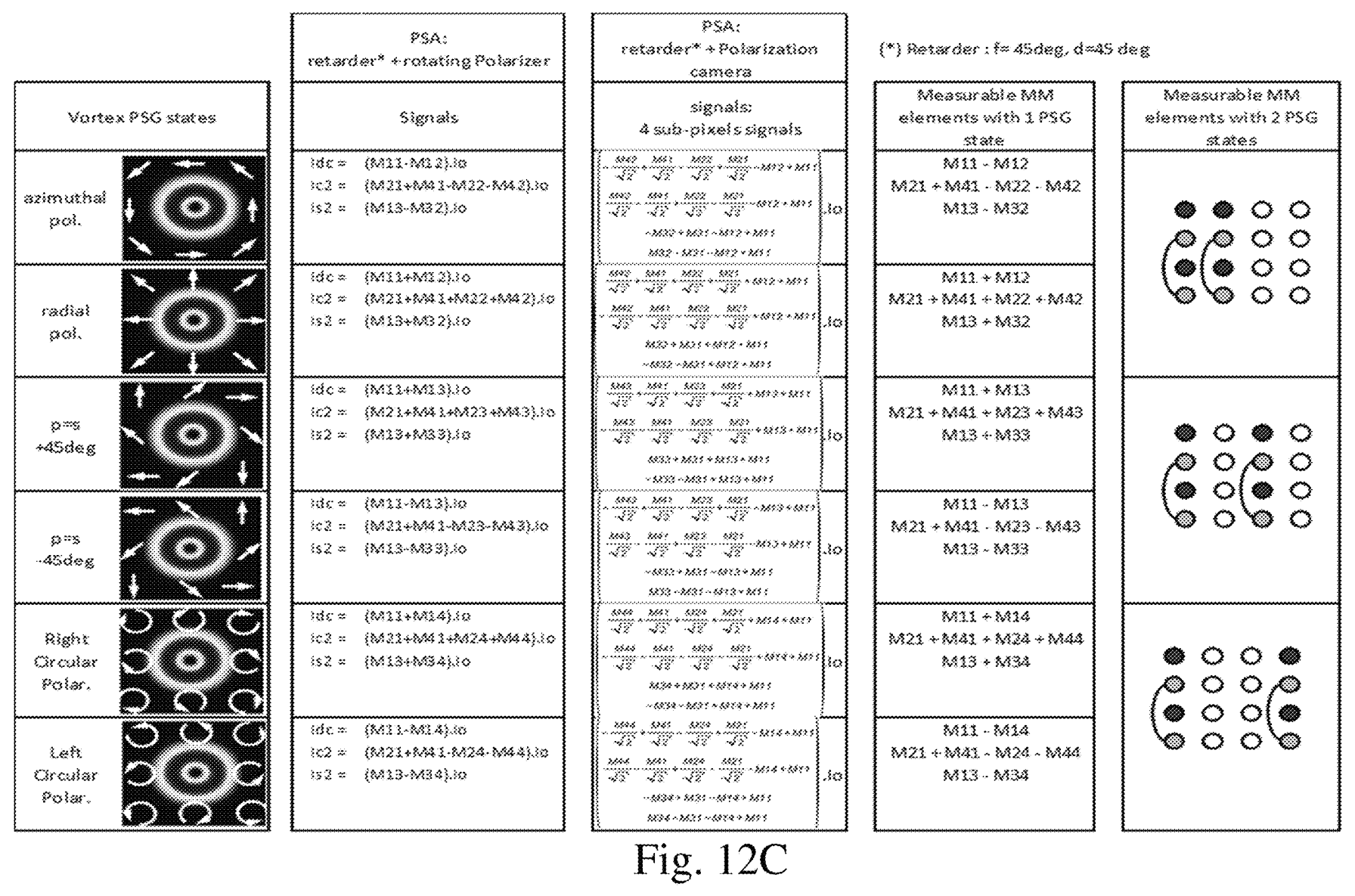

FIG. 12C, for example, is similar to FIG. 12A, and illustrates the measurable MM elements for a sample, or combination of those MM elements, from different polarization states induced by the PSG 110 and for different configurations of the PSA, which may be PSA 162 or 164, shown in FIG. 1. FIG. 12C represents configurations similar FIG. 12B, but in FIG. 12C, the retarder presents a retardation of 45 deg, i.e. a ⅛ waveplate. Unlike FIGS. 12A and 12B, the configuration of FIG. 12C, the combination of two PSG states (illustrated in column 5) does not allow for the measurement of six independent MM elements. Instead, as illustrated in column 5, four independent MM elements (black unconnected circles) may be measured, and two combinations (sum) of two MM elements (connected grey circles) may be measured.

Figure 12D:
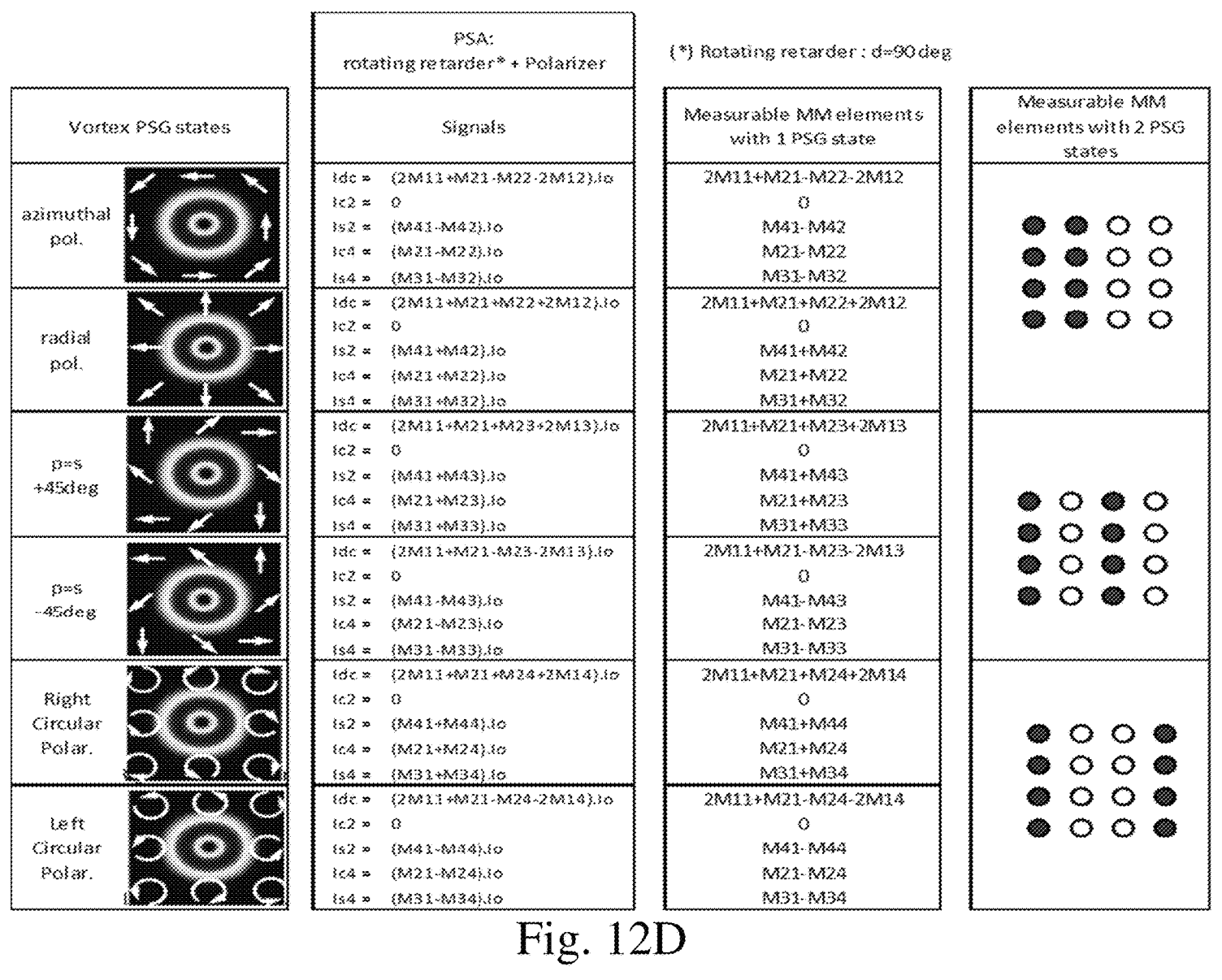

FIG. 12D, for example, is similar to FIG. 12A, and illustrates the measurable MM elements, for a sample, or combination of those MM elements, from different polarization states induced by the PSG 110 and for a PSA 162 or 164, that unlike in FIG. 12A-C, includes a rotating retarder 154, 158, that is ¼ waveplate, followed by a fixed polarizer 153, 157, and the detector 156 (which is a 2D sensor), 160. The fixed polarizer 153 and 2D sensor may be replaced by the polarization state camera 156, i.e., the PSA 162 includes a rotating retarder 154 and the polarization state camera 156. However, in this implementation, since the rotating element is a retarder 154, the use of the polarization state camera 156 would not bring any evident throughput or SNR benefit. Accordingly, FIG. 12D does not include a column illustrating a PSA configuration with a polarization state camera, equivalent to column 3 in FIGS. 12A-12C. Column 2 in FIG. 12D illustrates the cases where the PSA includes the rotating retarder in 154 and the fixed polarizer in 153 with a 2D-sensor detector in 156, or the rotating retarder in 158 and the fixed polarizer 157 before the hyper-spectral camera 160.

In the case of a rotating retarder the detector acquires N signals corresponding to different azimuths of the fast axis of the retarder. The Fourier Transform of those signals will give the DC, cos(2w), sin(2w), cos(4w) and sin(4w) components, noted Idc, Ic2, Is2, Ic4 and Is4 in column 2.

FIG. 12E, for example, is similar to FIG. 12D, and illustrates the measurable MM elements, for a sample, or combination of those MM elements, from different polarization states induced by the PSG 110 and for a PSA 162 or 164. FIG. 12E is illustrates a PSA configuration similar to that of FIG. 12D, but where the rotating retarder 154, 158 is a ⅛ waveplate. The configurations illustrated by FIGS. 12D and 12E, by way of example, advantageously enable measurement of all MM elements of the sample 140 using six polarization states of the PSG 110.

Figure 13:
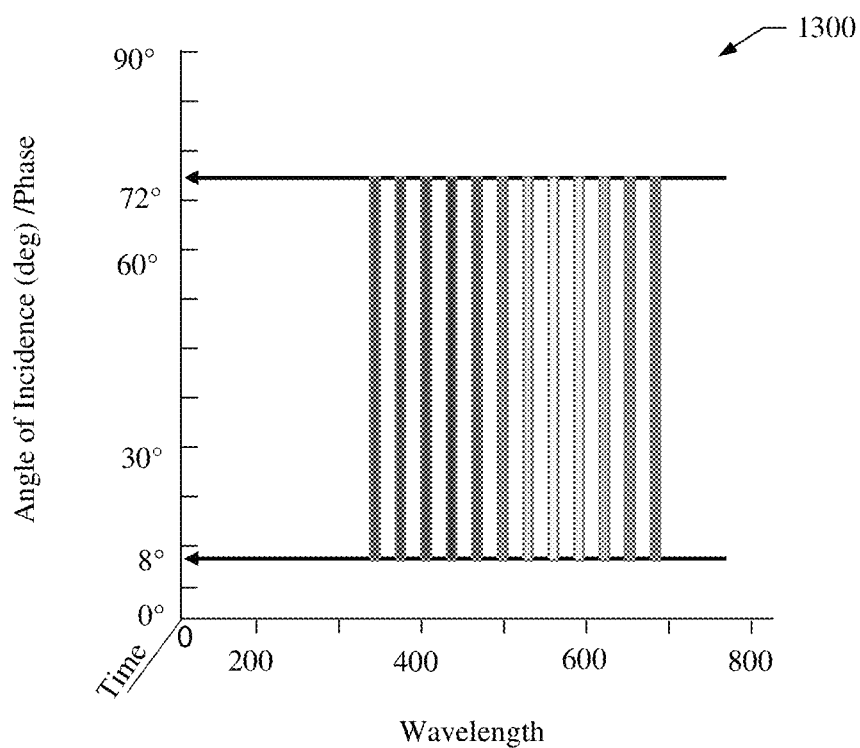
FIG. 13 is a graph illustrating the information provided by the metrology device operating as a hyperspectral vortex polarimeter with respect to time.

FIG. 13 is a graph 1300 illustrating the information provided by the metrology device 100 operating as a hyperspectral vortex polarimeter over time. As illustrated, with use of the hyperspectral vortex beam 111 it is possible to obtain data for all polarizations over a large number of wavelengths, e.g., approximately 80 wavelengths or more (anywhere between 350 nm to 1700 nm) and a large number of angles of incidence (AOI), e.g. between approximately 8° to 72°, in one shot, i.e., image capture, or at most 2 shots. If desired, additional shots may be performed, e.g. to capture data from the polarization imaging detector 156 at individual wavelengths.

Figure 14:
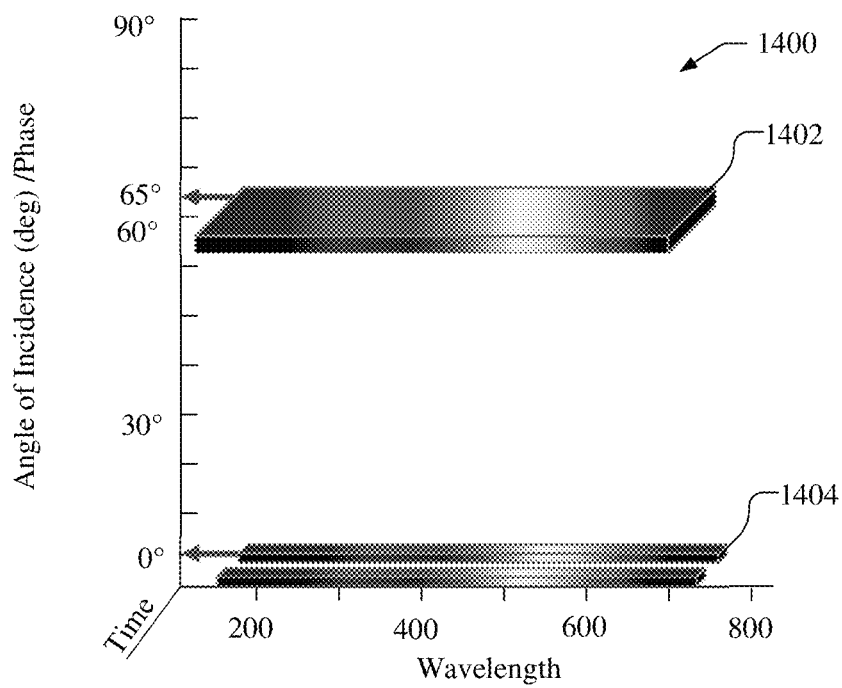
FIG. 14 is a graph illustrating the information provided by a conventional metrology device capturing spectral ellipsometry data and/or spectral reflectometry data with respect to time.

FIG. 14, by way of comparison, is a graph 1400 illustrating the information provided by a conventional metrology device capturing spectral ellipsometry data and/or spectral reflectometry data over time. As illustrated, the spectral ellipsometry 1402 data may include a large number of wavelengths, but is limited to a single angle of incidence (AOI), e.g., 65°, and the polarization information is measured over a period of time, e.g., full rotating compensator cycle. The spectral reflectometry 1404 data similarly may include a large number of wavelengths, but is limited to a single angle of incidence (AOI), e.g., 0°. Further, any phase information (spectral reflectometry data 1404 illustrates two polarizations) is also captured over a period of time as it may require a full scan for each polarization.

Thus, as can be seen in FIGS. 13 and 14, the metrology device 100 operating as a hyperspectral vortex polarimeter may increase the speed of acquisition of information and thus, increased throughput relative to conventional metrology systems.

Figure 15:
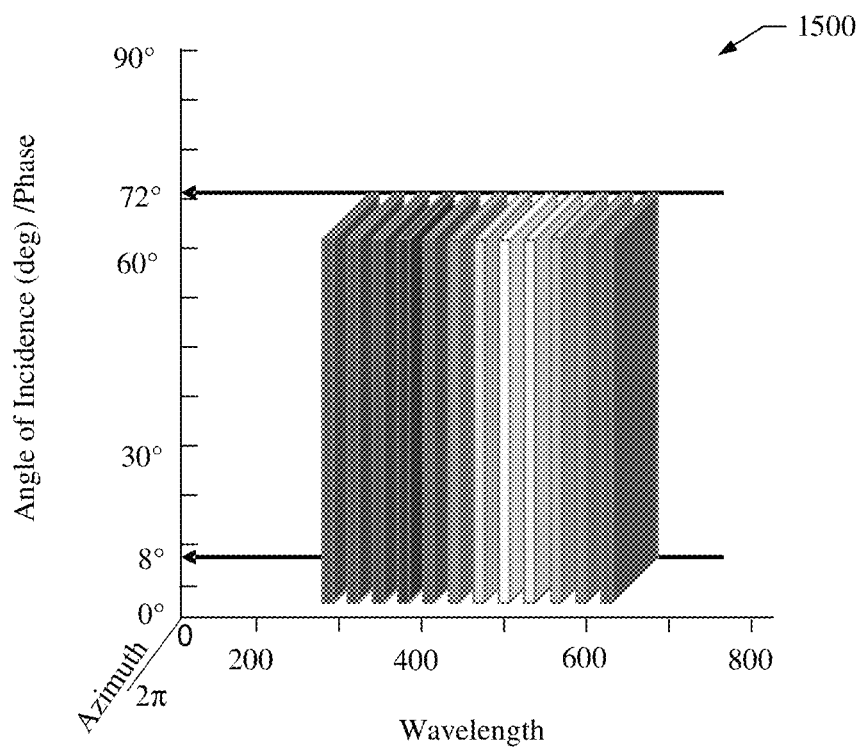
FIG. 15 is a graph illustrating the information density provided by the metrology device operating as a hyperspectral vortex polarimeter.

FIG. 15 is a graph 1500 illustrating the information density provided by the metrology device 100 operating as a hyperspectral vortex polarimeter, where the z axis represents azimuth angle. As illustrated, with use of the hyperspectral vortex beam 111 it is possible to obtain data for all polarizations over a large number of wavelengths, e.g., approximately 80 wavelengths or more (anywhere between 350 nm to 1700 nm) and a large number of angles of incidence (AOI), e.g. between approximately 8° to 72°, over a full set of azimuth angles, i.e., 0 to $2\pi$.

Figure 16:
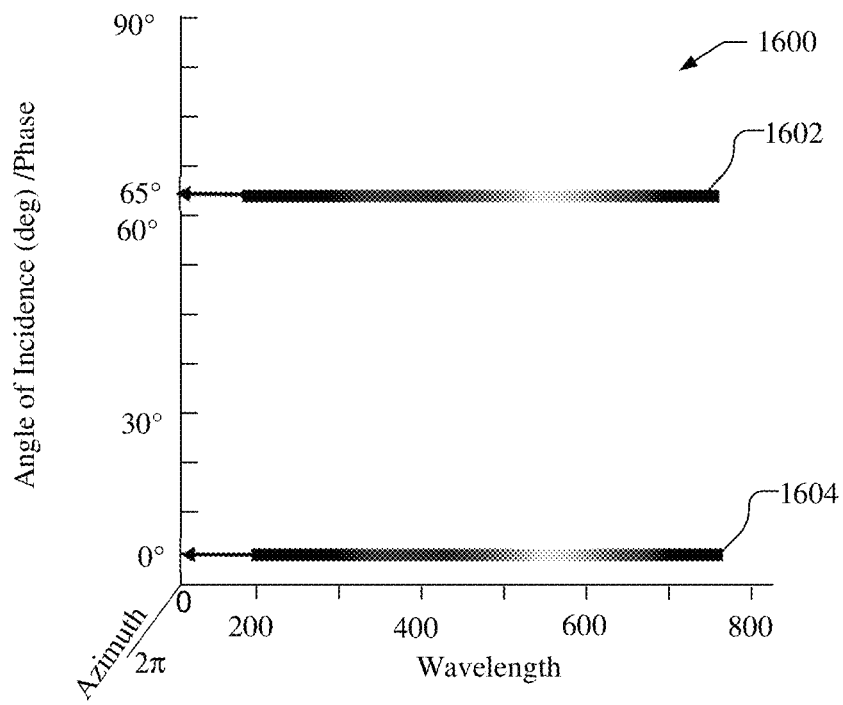
FIG. 16 is a graph illustrating the information density provided by a conventional metrology device capturing spectral ellipsometry data and/or spectral reflectometry data.

FIG. 16, by way of comparison, is a graph 1600 illustrating the information density provided by a conventional metrology device capturing spectral ellipsometry data and/or spectral reflectometry data, where the z axis represents azimuth angle. As illustrated, neither the spectral ellipsometry 1602 data nor the spectral reflectometry data 1604 provide information with respect to azimuth angles.

Thus, as can be seen in FIGS. 15 and 16, the metrology device 100 operating as a hyperspectral vortex polarimeter provides increased information density by simultaneously collecting angle of incidence and azimuth angle.

Figure 17:
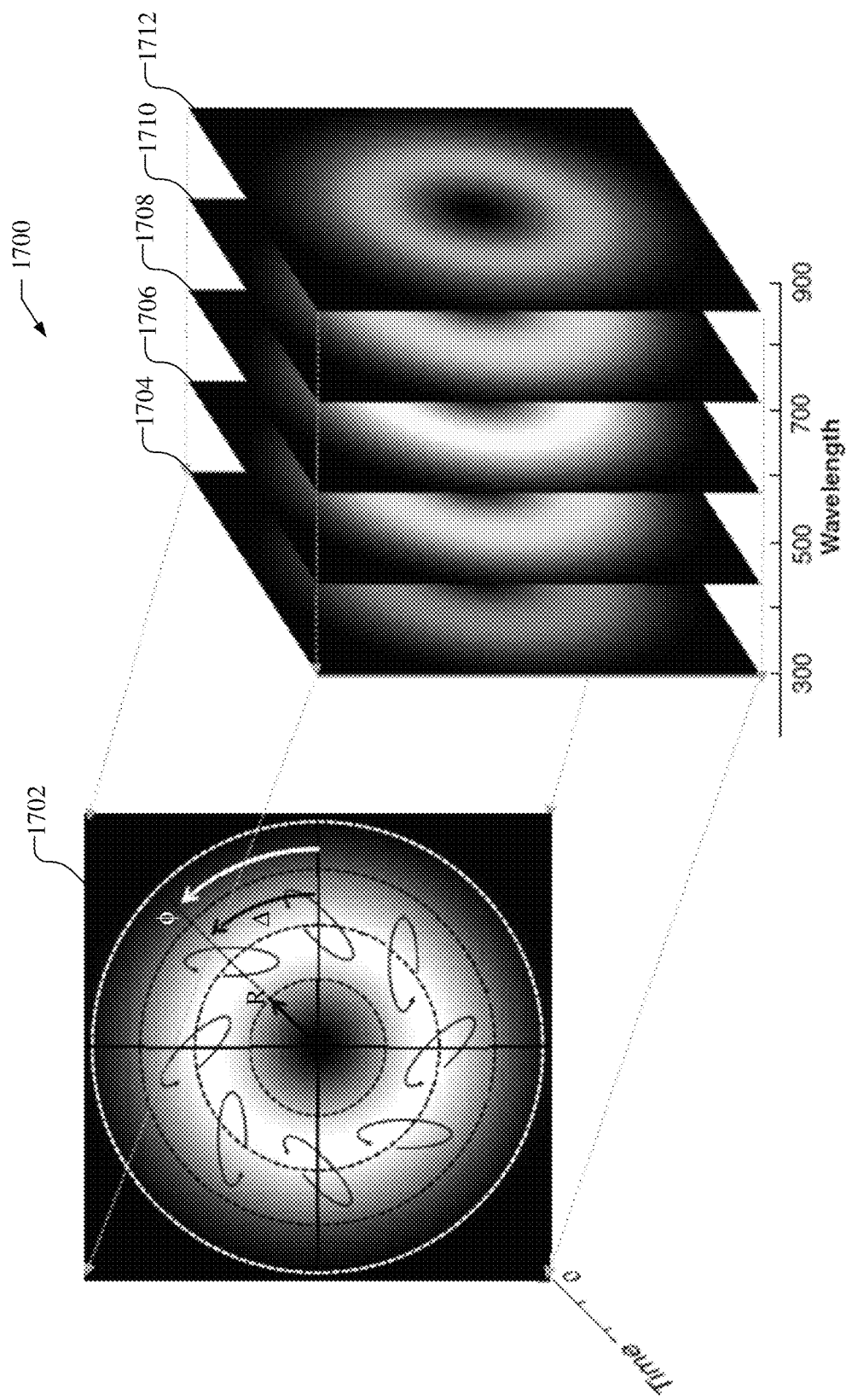
FIG. 17 illustrates a three dimensional cylindrical plot showing the information density captured by the metrology device.

FIG. 17 illustrates a three dimensional cylindrical plot 1700 showing the information density captured by the metrology device 100. As illustrated, the radius R in each image (illustrated by image 1702) captures the angle of incidence (AOI), e.g., from 0°-72°, the angle φ captures the azimuthal orientation of the infinite plane of incidence from 0-$2\pi$, and the angle Δ captures the programmable phase shift reference, e.g., depending on the type of vortex that is selected. Time may be illustrated in the Z axis, but is effectively the integration time for one acquisition, i.e., one shot. As illustrated by the multiple images 1704, 1706, 1708, 1710, 1712, the information may be captured simultaneously over multiple wavelengths. Thus, compared to the information acquired by a conventional metrology device, e.g., as illustrated in FIGS. 14 and 16, it can be seen that the metrology device 100 acquires more information, in substantially less time.

Figure 18:
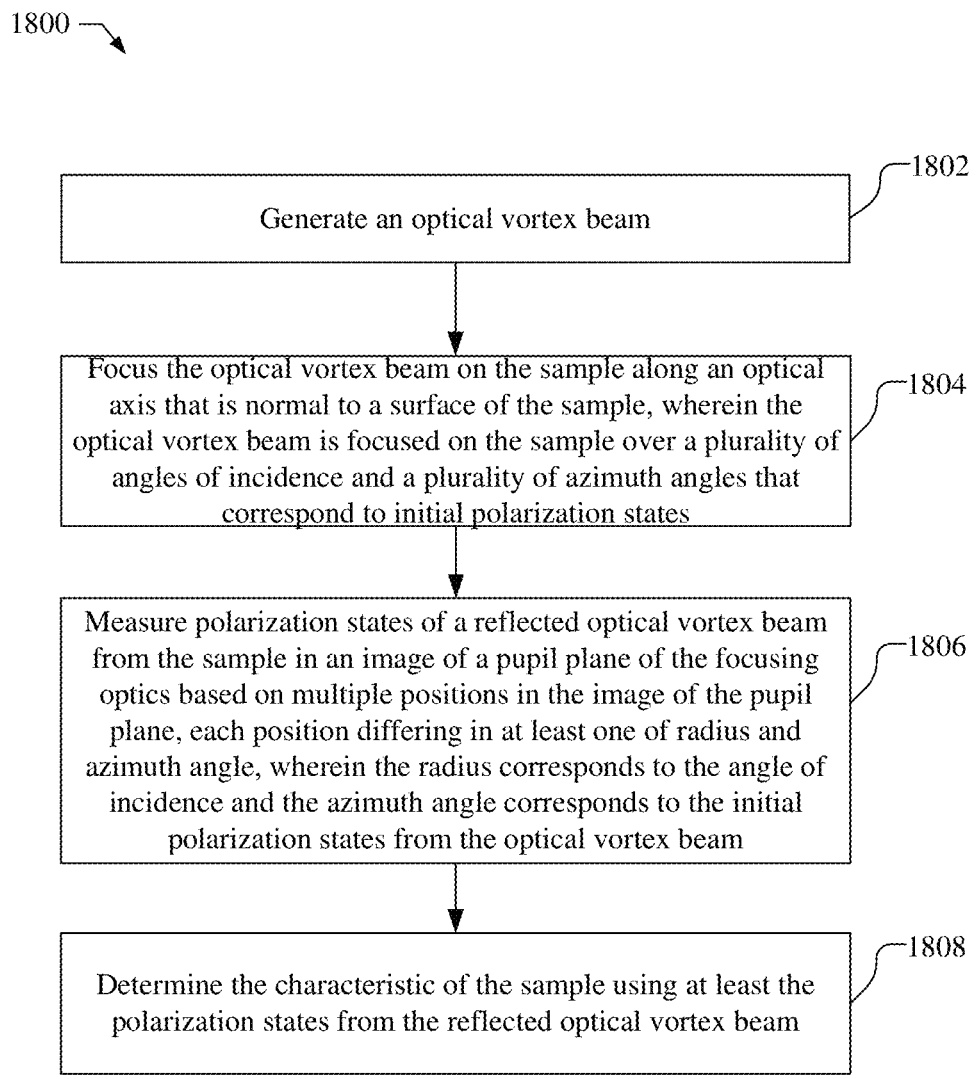
FIG. 18 is a flow chart illustrating a method of characterizing a sample using an optical metrology device, such as optical metrology device of FIG. 1.

FIG. 18 is a flow chart 1800 illustrating a method of characterizing a sample using an optical metrology device, such as optical metrology device 100 discussed herein. As illustrated at block 1802, an optical vortex beam is generated. For example, the optical metrology device may convert a light beam into an optical vortex beam. The optical vortex beam may include azimuthally varying polarization states and/or azimuthally varying phase states. The optical vortex beam may be generated by transforming a light beam with an azimuthal retarder and a waveplate to produce spatial modulation of the polarization states as a function of azimuth angle. Additionally, the optical vortex beam may be produced with a plurality of wavelengths. A means for generating the optical vortex beam, for example, may include the light source 102, polarizer 112, the azimuthally varying retarder 114, which may be a spiral phase plate, an s-plate, a q-plate, an spatial light modulator (SLM) programmed to produce the optical vortex beam, and a quarter waveplate or half waveplate, such as waveplates 113 and/or 115.

At block 1804, the optical vortex beam is focused on the sample along an optical axis that is normal to a surface of the sample, wherein the optical vortex beam is focused on the sample over a plurality of angles of incidence and a plurality of azimuth angles that correspond to initial polarization states. For example, the optical vortex beam may be focused using an objective lens with a high numerical aperture, e.g., greater than 0.8 NA, that is sufficient to focus light over angles of incidence from 0 degrees to at least 70 degrees. A means for focusing the optical vortex beam on the sample along an optical axis that is normal to a surface of the sample, wherein the optical vortex beam is focused on the sample over a plurality of angles of incidence and a plurality of azimuth angles that correspond to initial polarization states, for example, may include beam splitter 132 and objective lens 134.

At block 1806, the optical metrology device may measure polarization states of a reflected optical vortex beam from the sample in an image of a pupil plane of the focusing optics based on multiple positions in the image of the pupil plane, each position differing in at least one of radius and azimuth angle, wherein the radius corresponds to the angle of incidence and the azimuth angle corresponds to the initial polarization states from the optical vortex beam. In some implementations, the polarization states may be measured simultaneously by detecting a plurality of polarization states of the reflected optical vortex beam at the multiple positions in the image of the pupil plane. The polarization states may be measured for a plurality of wavelengths. In some implementations, the reflected optical vortex beam may be polarized at one or more polarization states before measuring the polarization. For example, in some implementation, the image of the reflected optical vortex beam may be detected using macro pixels, where each macro pixel detects a plurality of different polarization states. In some implementations, the image of the reflected optical vortex beam may be detected using macro pixels, where each macro pixel detects each of a plurality of different wavelengths. In one implementation, the macro pixel may further detect a combination of the plurality of different wavelengths that may be used as a reference signal to reduce SNR. A means for measuring polarization states of a reflected optical vortex beam from the sample in an image of a pupil plane of the focusing optics based on multiple positions in the image of the pupil plane, each position differing in at least one of radius and azimuth angle, wherein the radius corresponds to the angle of incidence and the azimuth angle corresponds to the initial polarization states from the optical vortex beam, for example, may include waveplate 154A, polarizer 154B, wavelength separator 155, polarization imaging detector 156, polarizer 157, waveplate 158, and hyperspectral imagining detector 160.

At block 1808, the characteristic of the sample is determined using at least the polarization states from the reflected optical vortex beam, e.g., from the received image of the pupil plane. For example, one or more Mueller Matrix elements, including the N, C, and S components may be determined using the polarization from the reflected vortex beam as the position of the angle of incidence and the azimuth angle. The means for determining the characteristic of the sample using at least the polarization states from the reflected optical vortex beam, for example, may be the one or more processors 172 in a computer system 170.

Reference throughout this specification to "one example", "an example", "certain examples", or "exemplary implementation" means that a particular feature, structure, or characteristic described in connection with the feature and/or example may be included in at least one feature and/or example of claimed subject matter. Thus, the appearances of the phrase "in one example", "an example", "in certain examples" or "in certain implementations" or other like phrases in various places throughout this specification are not necessarily all referring to the same feature, example, and/or limitation. Furthermore, the particular features, structures, or characteristics may be combined in one or more examples and/or features.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof.

What is claimed is:

1. An optical metrology device capable of determining a characteristic of a sample, the optical metrology device comprising:
   a polarization state generator that converts a light beam into an optical vortex beam;
   focusing optics having an optical axis that is normal to a surface of the sample, the focusing optics focusing the optical vortex beam on the sample over a plurality of angles of incidence and a plurality of azimuth angles that correspond to initial polarization states;
   a detector that receives a reflected optical vortex beam from the sample in an image of a pupil plane of the focusing optics and measures polarization states from the reflected optical vortex beam based on multiple positions in the image of the pupil plane, each position differing in at least one of radius and azimuth angle, wherein the radius corresponds to the angle of incidence and the azimuth angle corresponds to the initial polarization states from the optical vortex beam; and
   at least one processor that receives the image of the pupil plane from the detector and determines the characteristic of the sample using at least the polarization states from the reflected optical vortex beam.

2. The optical metrology device of claim 1, wherein the optical vortex beam comprises azimuthally varying phase and polarization states.

3. The optical metrology device of claim 1, wherein the polarization state generator comprises an azimuthal retarder and a waveplate to produce spatial modulation of polarization states as a function of azimuth angle.

4. The optical metrology device of claim 1, wherein the detector simultaneously measures the polarization states from the reflected optical vortex beam and comprises a plurality of macro pixels, each macro pixel comprising a plurality of sub pixels and a plurality of polarizers having different polarization states and each of the plurality of polarizers is aligned with a pixel in a two-dimensional sensor.

5. The optical metrology device of claim 1, further comprising a light source that produces the light beam, the light source produces light having multiple wavelengths, wherein the detector measures the polarization states from the reflected optical vortex beam at a plurality of wavelengths.

6. The optical metrology device of claim 1, wherein the light beam comprises a plurality of wavelengths, wherein the detector measures the polarization states from the reflected optical vortex beam for the plurality of wavelengths.

7. The optical metrology device of claim 6, wherein the detector comprises a hyperspectral imaging sensor.

8. The optical metrology device of claim 6, further comprising a retarder, wherein a polarizer is between the retarder and the detector.

9. The optical metrology device of claim 1, further comprising a rotating polarizer before the detector.

10. The optical metrology device of claim 1, wherein the plurality of angles of incidence produced by the focusing optics of from 0 degrees to at least 70 degrees.

11. The optical metrology device of claim 1, wherein the at least one processor determines components of a Mueller Matrix for the sample using the polarization states from the reflected optical vortex beam.

12. A method of characterizing a sample using an optical metrology device, the method comprising:
   generating an optical vortex beam;
   focusing the optical vortex beam on the sample along an optical axis that is normal to a surface of the sample, wherein the optical vortex beam is focused on the sample over a plurality of angles of incidence and a plurality of azimuth angles that correspond to initial polarization states;
   measuring polarization states of a reflected optical vortex beam from the sample in an image of a pupil plane of focusing optics based on multiple positions in the image of the pupil plane, each position differing in at least one of radius and azimuth angle, wherein the radius corresponds to the angle of incidence and the azimuth angle corresponds to the initial polarization states from the optical vortex beam; and determining a characteristic of the sample using at least the polarization states from the reflected optical vortex beam.

13. The method of claim 12, wherein the optical vortex beam comprises azimuthally varying phase and polarization states.

14. The method of claim 12, wherein generating the optical vortex beam comprises transforming a light beam with an azimuthal retarder and a waveplate to produce spatial modulation of polarization states as a function of azimuth angle.

15. The method of claim 12, wherein the polarization states are measured simultaneously by detecting a plurality of polarization states of the reflected optical vortex beam at the multiple positions in the image of the pupil plane.

16. The method of claim 12, wherein the optical vortex beam comprises a plurality of wavelengths, wherein the polarization states are measured for the plurality of wavelengths.

17. The method of claim 12, wherein the plurality of angles of incidence is from 0 degrees to at least 70 degrees.

18. The method of claim 12, further comprising determining components of a Mueller Matrix for the sample using the polarization states from the reflected optical vortex beam.

19. An optical metrology device capable of determining a characteristic of a sample, the optical metrology device comprising:
  means for generating an optical vortex beam;
  means for focusing the optical vortex beam on the sample along an optical axis that is normal to a surface of the sample, wherein the optical vortex beam is focused on the sample over a plurality of angles of incidence and a plurality of azimuth angles that correspond to initial polarization states;
  means for measuring polarization states of a reflected optical vortex beam from the sample in an image of a pupil plane of focusing optics based on multiple positions in the image of the pupil plane, each position differing in at least one of radius and azimuth angle, wherein the radius corresponds to the angle of incidence and the azimuth angle corresponds to the initial polarization states from the optical vortex beam; and
  means for determining the characteristic of the sample using at least the polarization states from the reflected optical vortex beam.

20. The optical metrology device of claim 19, wherein the optical vortex beam comprises a plurality of wavelengths and the polarization states are measured for the plurality of wavelengths.

\* \* \* \* \*

UNITED STATES PATENT AND TRADEMARK OFFICE
CERTIFICATE OF CORRECTION

PATENT NO. : 11,346,768 B1  
APPLICATION NO. : 17/110214  
DATED : May 31, 2022  
INVENTOR(S) : Kenneth E. James, John F. Lesoine and Pedro Vagos It is certified that error appears in the above-identified patent and that said Letters Patent is hereby corrected as shown below:

In the Specification

Column 13, Line 15, "The retarder is ¼ waveplate (d=90 deg) with the fast axis at 45 deg (f=45 deg)." to read as "The retarder is a ¼ waveplate (d=90 deg) with the fast axis at 45 deg (f=45 deg)."

Column 13, Line 45, "includes a rotating retarder 154, 158, that is ¼ waveplate." to read as "includes a rotating retarder 154, 158, that is a ¼ waveplate."

Signed and Sealed this  
Twenty-fourth Day of January, 2023

Katherine Kelly Vidal  
*Director of the United States Patent and Trademark Office*